(12) United States Patent
Lee et al.

(10) Patent No.: US 11,021,796 B2
(45) Date of Patent: Jun. 1, 2021

(54) GAS INJECTORS AND WAFER PROCESSING APPARATUSES HAVING THE SAME

(71) Applicant: Samsung Electronics Co., Ltd., Suwon-si (KR)

(72) Inventors: Jong-Hyun Lee, Seoul (KR); Young-Kwon Kim, Hwaseong-si (KR); Woo-Jae Kim, Suwon-si (KR); Seung-Min Ryu, Suwon-si (KR); Ji-Ho Uh, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 152 days.

(21) Appl. No.: 16/212,036

(22) Filed: Dec. 6, 2018

(65) Prior Publication Data
US 2019/0330741 A1 Oct. 31, 2019

(30) Foreign Application Priority Data
Apr. 25, 2018 (KR) .................. 10-2018-0047714

(51) Int. Cl.
*H01L 21/67* (2006.01)
*C23C 16/52* (2006.01)
(Continued)

(52) U.S. Cl.
CPC .......... *C23C 16/52* (2013.01); *C23C 16/0227* (2013.01); *C23C 16/45565* (2013.01); *H01L 21/67248* (2013.01); *H01L 21/67303* (2013.01)

(58) Field of Classification Search
CPC .............. C23C 16/52; C23C 16/45565; C23C 16/0227; C23C 16/4584; C23C 16/45578;
(Continued)

(56) References Cited

U.S. PATENT DOCUMENTS 5,453,124 A * 9/1995 Moslehi ............ C23C 16/45561
                                                          118/715
5,618,349 A     4/1997 Yuuki
(Continued)

FOREIGN PATENT DOCUMENTS

KR      10-0427524 B1    4/2004
KR      10-0712529 B1    4/2007
(Continued)

*Primary Examiner* — Rudy Zervigon
(74) *Attorney, Agent, or Firm* — Harness, Dickey & Pierce, P.L.C.

(57) ABSTRACT

A gas injector includes first and second gas introduction passages extending in a first direction toward a central axis of a process chamber respectively, a first bypass passage extending from the first gas introduction passage in a second direction that is substantially perpendicular to the first direction, a second bypass passage extending from the second gas introduction passage in a reverse direction to the second direction, a first distribution passage isolated from the first bypass passage in the first direction and extending from an outlet of the first bypass passage in the reverse direction to the second direction, a second distribution passage isolated from the second bypass passage in the first direction and extending from an outlet of the second bypass passage in the second direction, and a plurality of spray holes in an outer surface of the first and second distribution passages and configured to spray the process gas.

18 Claims, 28 Drawing Sheets

(51) Int. Cl.
*C23C 16/455* (2006.01)
*C23C 16/02* (2006.01)
*H01L 21/673* (2006.01)

(58) Field of Classification Search
CPC ......... H01L 21/67303; H01L 21/67248; H01L 21/67028; B08B 5/02
USPC ....................................... 118/715; 156/345.1
See application file for complete search history.

(56) References Cited

U.S. PATENT DOCUMENTS

| | | | |
|---|---|---|---|
| 5,992,453 A * | 11/1999 | Zimmer | B05C 1/10 137/561 A |
| 6,444,039 B1 * | 9/2002 | Nguyen | C23C 16/455 118/715 |
| 6,830,624 B2 | 12/2004 | Janakiraman et al. | |
| 6,849,241 B2 * | 2/2005 | Dauelsberg | C23C 16/45514 117/102 |
| 7,497,963 B2 | 3/2009 | Lee et al. | |
| 7,560,712 B2 | 7/2009 | Kim et al. | |
| 7,861,668 B2 | 1/2011 | Toyoda et al. | |
| 8,361,274 B2 | 1/2013 | Lee et al. | |
| 8,455,352 B1 | 6/2013 | Zheng et al. | |
| 8,652,970 B2 | 2/2014 | Tajima et al. | |
| 9,216,609 B2 | 12/2015 | Inoue et al. | |
| 2006/0086461 A1 | 4/2006 | Inada et al. | |
| 2007/0051387 A1 | 3/2007 | Hwang et al. | |
| 2009/0029561 A1 | 1/2009 | Fukuda et al. | |
| 2010/0041212 A1 | 2/2010 | Jinzu et al. | |
| 2014/0048208 A1 | 2/2014 | Kim | |
| 2014/0287588 A1 | 9/2014 | Takahashi | |
| 2015/0107517 A1 | 4/2015 | Hasebe et al. | |
| 2015/0167168 A1 * | 6/2015 | Keshavamurthy | C23C 16/455 438/758 |
| 2016/0326651 A1 | 11/2016 | Sato | |
| 2017/0232457 A1 | 8/2017 | Fujino et al. | |

FOREIGN PATENT DOCUMENTS

| | | |
|---|---|---|
| KR | 2007-0070752 A | 7/2007 |
| KR | 10-0757347 B1 | 9/2007 |
| KR | 10-1025324 B1 | 3/2011 |
| KR | 10-1190148 B1 | 10/2012 |
| KR | 10-1297926 B1 | 8/2013 |
| KR | 2014-0023807 A | 2/2014 |
| KR | 10-1571619 B1 | 11/2015 |

* cited by examiner

GAS INJECTORS AND WAFER PROCESSING APPARATUSES HAVING THE SAME

CROSS-REFERENCE TO RELATED APPLICATION

This application claims priority under 35 U.S.C. § 119 to Korean Patent Application No. 10-2018-0047714, filed on Apr. 25, 2018 in the Korean Intellectual Property Office (KIPO), the contents of which are herein incorporated by reference in their entirety.

BACKGROUND

1. Field

Some example embodiments relate to gas injectors and wafer processing apparatuses. More particularly, some example embodiments relate to gas injectors configured to supply a process gas into a process chamber and wafer processing apparatuses including the same.

2. Description of the Related Art

In semiconductor manufacturing processes, a cleaning process may be performed on a plurality of vertically stacked wafers within a batch type chamber to remove a native oxide layer on a wafer surface. A shower head having a plurality of spray holes formed therein may be used as the gas injector for cleaning process. However, a temperature difference between process gases sprayed from the spray holes along a vertical direction may generate a cleaning performance difference, thereby deteriorating a performance of a semiconductor device.

SUMMARY

Some example embodiments provide a gas injector capable of providing uniform temperature and flow rates of a process gas along an extending direction.

Some example embodiments provide a wafer processing apparatus having the gas injector.

According to some example embodiments, a gas injector may include a first gas introduction passage and a second gas introduction passage, a first bypass passage, a second bypass passage, a first distribution passage, a second distribution passage, and a plurality of spray holes. Each gas introduction passage of the first gas introduction passage and the second gas introduction passage may extend in a first direction toward a central axis of a process chamber. Each gas introduction passage of the first gas introduction passage and the second gas introduction passage may be configured to direct a process gas from a gas supply source into the process chamber. The first bypass passage may extend from the first gas introduction passage in a second direction. The second direction may be substantially perpendicular to the first direction. The second bypass passage may extend from the second gas introduction passage in a reverse direction to the second direction. The first distribution passage may be isolated from the first bypass passage in the first direction and may extend from an outlet of the first bypass passage in the reverse direction to the second direction. The second distribution passage may be isolated from the second bypass passage in the first direction and may extend from an outlet of the second bypass passage in the second direction. The plurality of spray holes may be an outer surface of the first and second distribution passages. The plurality of spray holes may be configured to spray the process gas.

According to some example embodiments, a gas injector may include a gas introduction passage extending in a first direction toward a central axis of a process chamber, a bypass passage extending from the gas introduction passage in a second direction, the second direction substantially perpendicular to the first direction, a distribution passage isolated from the bypass passage in the first direction and extending from an outlet of the bypass passage in a reverse direction to the second direction, and a plurality of spray holes in an outer surface of the distribution passage. The gas introduction passage may be configured to direct a process gas from a gas supply source into the process chamber. The plurality of spray holes may be spaced apart from each other along an extending direction of the distribution passage. The plurality of spray holes may be configured to spray the process gas.

According to some example embodiments, a wafer processing apparatus may include a process chamber extending in a vertical direction, a boat configured to be loaded into the process chamber, the boat configured to hold a plurality of wafers, and a gas injector configured to supply a process gas into the process chamber. The gas injector may include a gas introduction passage extending in a first direction toward a central axis of the process chamber, the gas introduction passage configured to direct the process gas into the process chamber. The gas injector may further include a bypass passage extending from the gas introduction passage in a second direction, the second direction substantially perpendicular to the first direction. The gas injector may further include a distribution passage isolated from the bypass passage in the first direction and extending from an outlet of the bypass passage in a reverse direction to the second direction. The gas injector may further include a plurality of spray holes in an outer surface of the distribution passage, the plurality of spray holes spaced apart from each other along an extending direction of the distribution passage, the plurality of spray holes configured to spray the process gas.

According to some example embodiments, a gas injector may include a gas introduction passage extending in a first direction, a bypass passage extending from the gas introduction passage in a second direction perpendicular to the first direction toward a top or a bottom of a process chamber, and a distribution passage arranged further inside the process chamber than the bypass passage and extending from an outlet of the bypass passage in a reverse direction to the second direction. A plurality of spray holes may be formed in an outer wall of the distribution passage to spray a process gas flowing through the distribution passage.

Accordingly, while the process gas flows from the outlet of the bypass passage along the distribution passage, the process gas may be thermally compensated by the adjacent bypass passage having relatively high temperature, to thereby provide uniform temperature and flow rates between the spray holes along the vertical direction. Thus, a cleaning performance difference between vertically stacked wafers within the process chamber may be reduced to thereby improve a performance of a semiconductor device.

BRIEF DESCRIPTION OF THE DRAWINGS

Some example embodiments will be more clearly understood from the following detailed description taken in conjunction with the accompanying drawings. FIGS. 1 to 30 represent non-limiting, some example embodiments as described herein.

FIG. 1 is a block diagram illustrating a wafer processing apparatus in accordance with some example embodiments.

FIG. 2 is a cross-sectional view illustrating a process chamber in FIG. 1.

FIG. 3 is a cross-sectional view taken along the line III-III' in FIG. 2.

FIG. 4 is a cross-sectional view illustrating a flow of a process gas supplied through a gas injector in FIG. 2.

FIG. 5 is a perspective view illustrating the gas injector in FIG. 2.

FIG. 6 is an exploded perspective view illustrating the gas injector in FIG. 5.

FIG. 7 is a perspective view taken along an extending direction of the gas injector in FIG. 5.

FIG. 8 is a side view illustrating the gas injector in FIG. 7.

FIG. 9 is a cross-sectional view illustrating a first distribution passage of the gas injector in FIG. 5.

FIG. 10 is a cross-sectional view illustrating another example of a first distribution passage.

FIG. 12 is a cross-sectional view illustrating a gas injector in accordance with comparative embodiments.

FIG. 13 is a graph illustrating a temperature profile of a process gas along an extending direction, which is sprayed by the gas injector in FIG. 5 and the gas injector in FIG. 12 respectively.

FIG. 14 is a graph illustrating a flow rate profile of a process gas along an extending direction, which is sprayed by the gas injector in FIG. 5 and the gas injector in FIG. 12 respectively.

FIG. 15 is a cross-sectional view illustrating a gas injector in accordance with some example embodiments.

FIG. 16 is a cross-sectional view illustrating a gas injector in accordance with some example embodiments.

FIG. 17 is a perspective view illustrating a gas injector in accordance with some example embodiments.

FIG. 18 is an exploded perspective view illustrating the gas injector in FIG. 17.

FIG. 19 is a perspective view taken along an extending direction of the gas injector in FIG. 17.

FIG. 20 is a side view illustrating the gas injector in FIG. 19.

FIG. 21 is an enlarged cross-sectional view illustrating a first bypass passage and a first distribution passage of the gas injector in FIG. 17.

FIG. 22 is a cross-sectional view illustrating a gas injector in accordance with some example embodiments.

FIG. 23 is a cross-sectional view illustrating a gas injector in accordance with some example embodiments.

FIG. 24 is a cross-sectional view illustrating a gas injector in accordance with some example embodiments.

FIG. 25 is a cross-sectional view illustrating a gas injector in accordance with some example embodiments.

FIG. 26 is a flow chart illustrating a method of processing a wafer in accordance with some example embodiments.

FIGS. 27, 28, 29, and 30 are vertical cross-sectional views illustrating a method of manufacturing a vertical memory device in accordance with some example embodiments.

DETAILED DESCRIPTION

Hereinafter, some example embodiments will be explained in detail with reference to the accompanying drawings.

Figure 1:
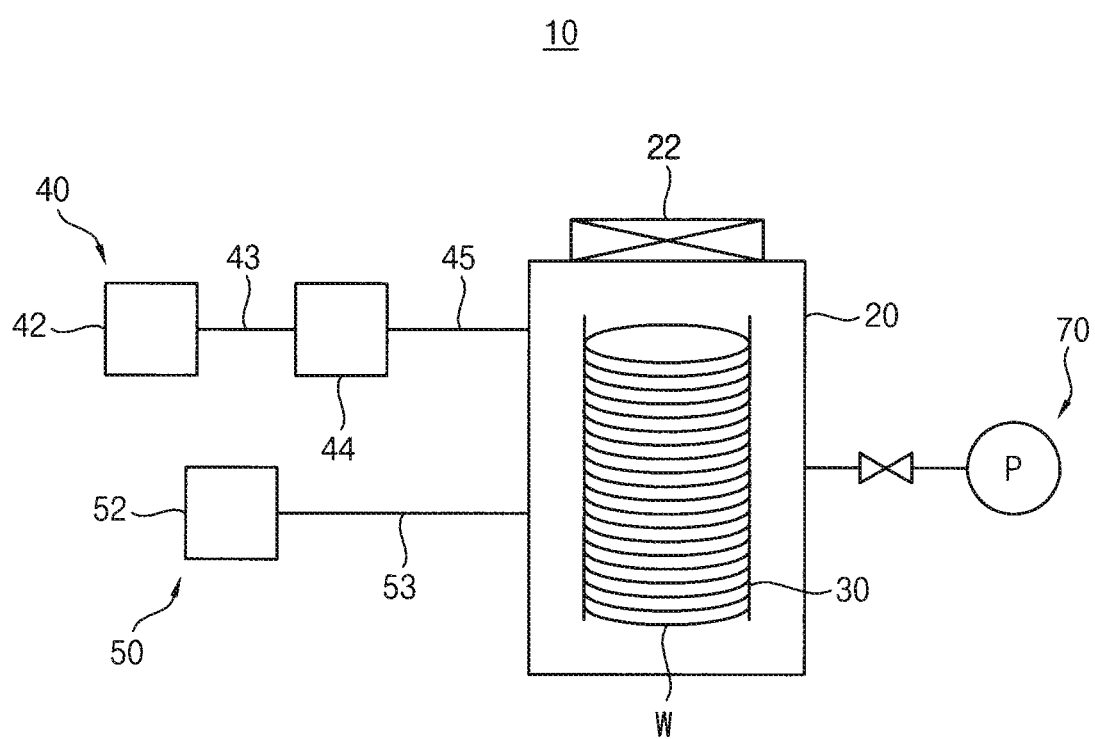
Figure 2:
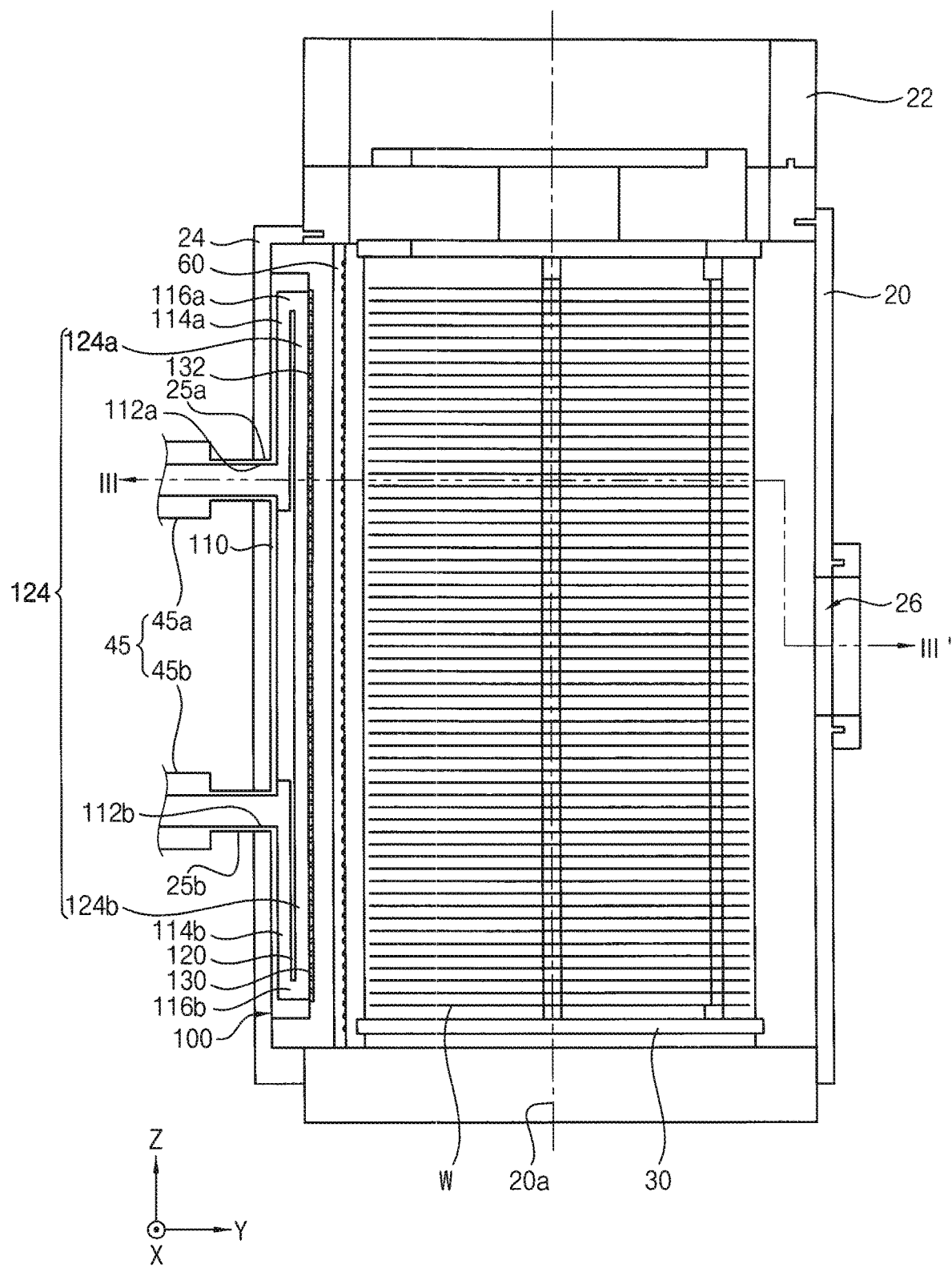
Figure 3:
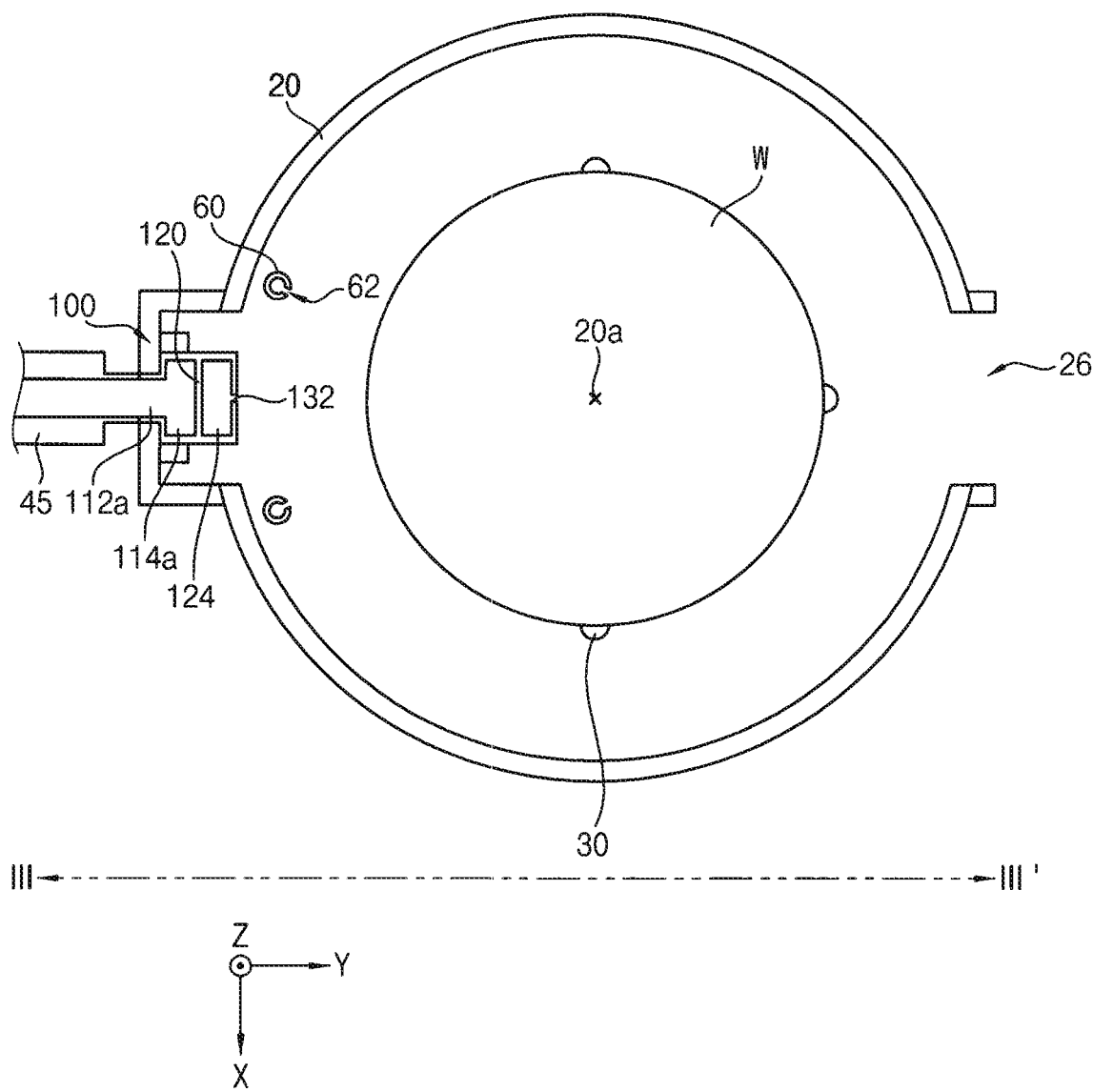
Figure 4:
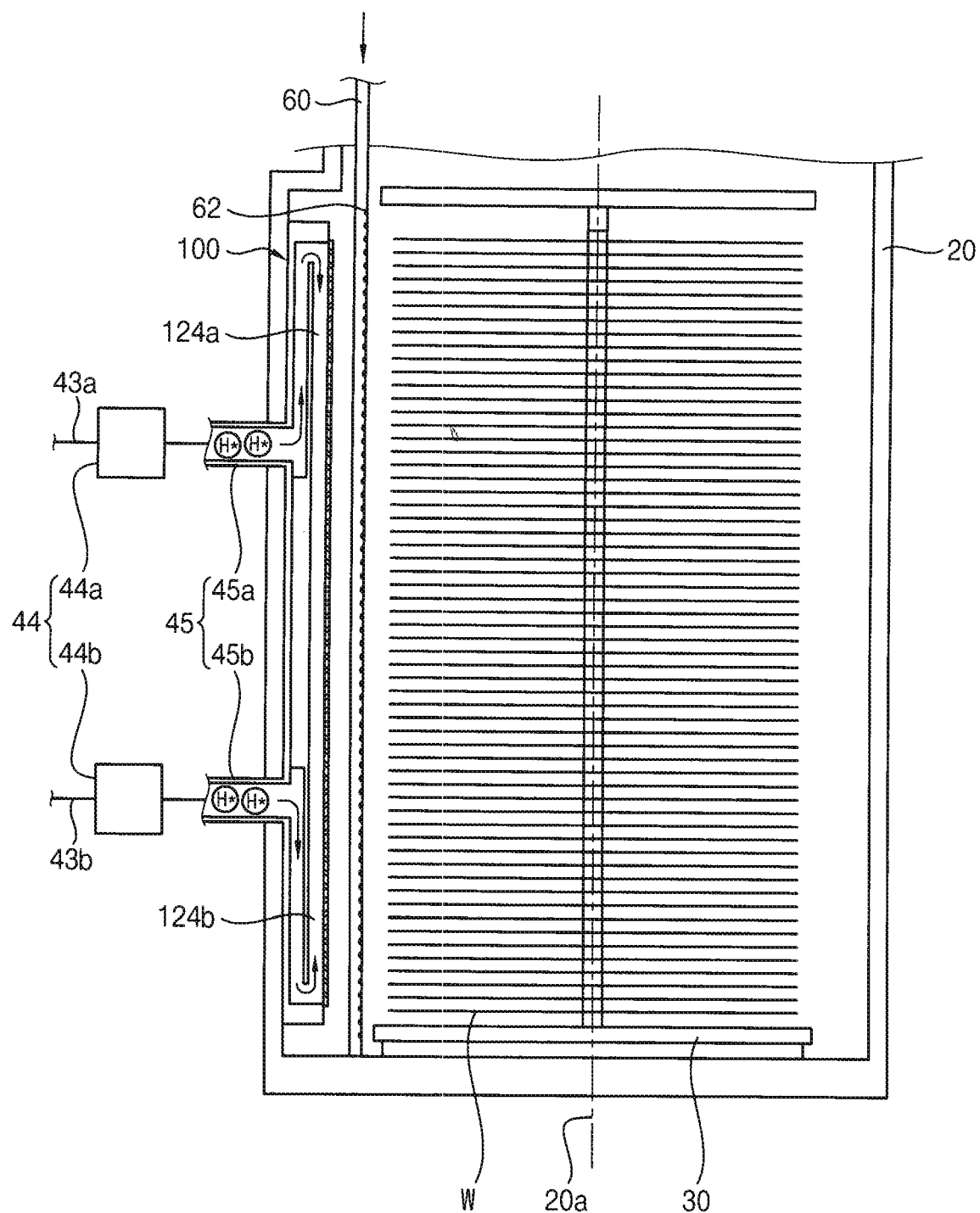
Figure 5:
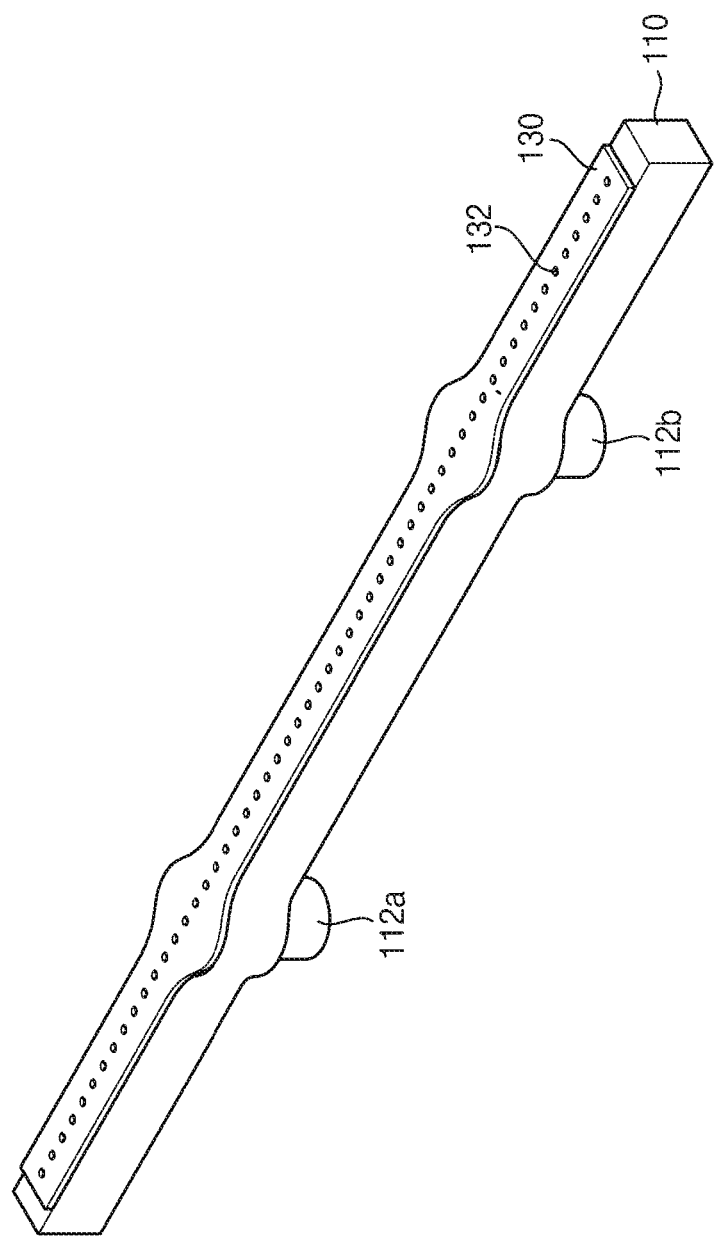
Figure 6:
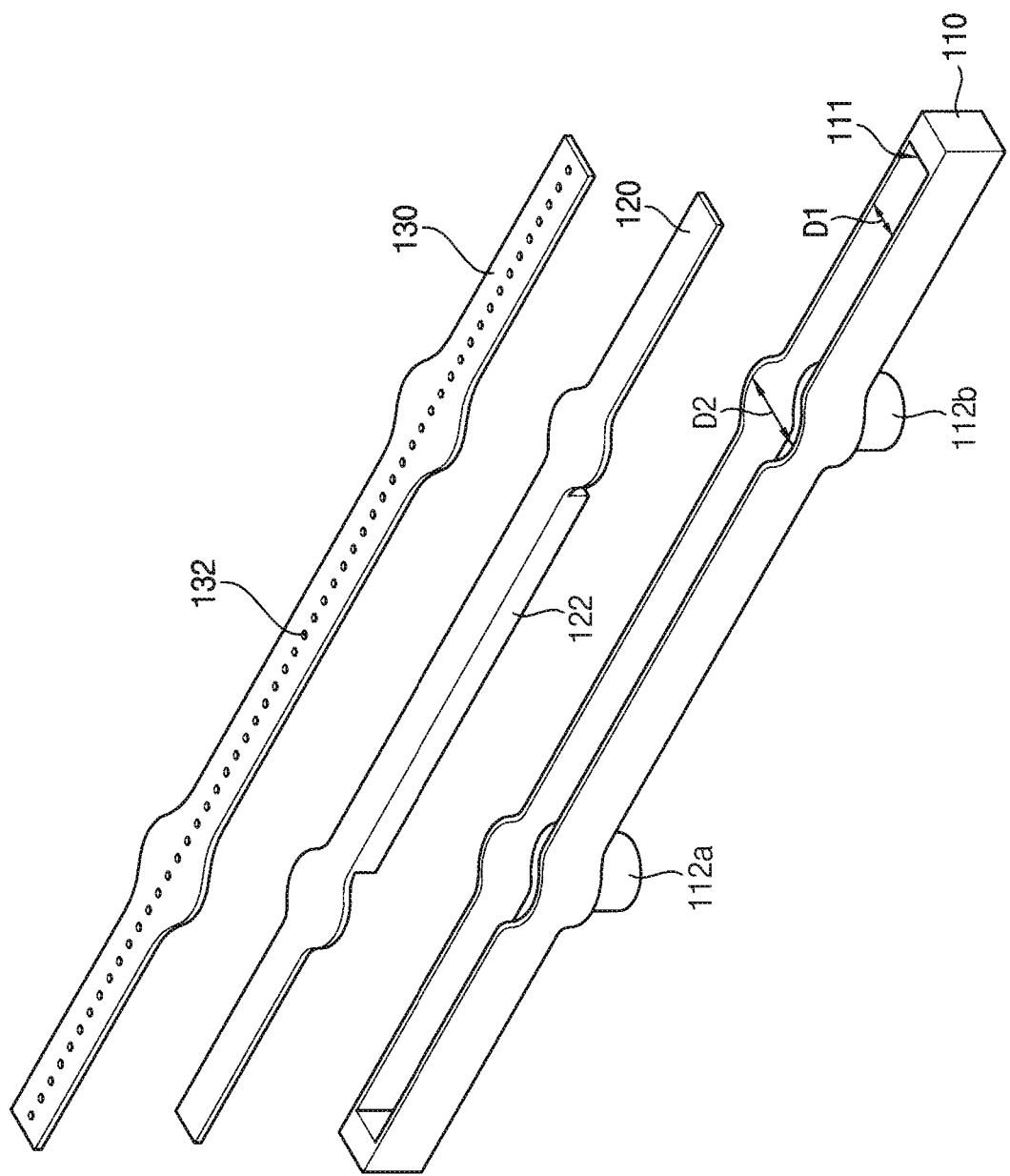
Figure 7:
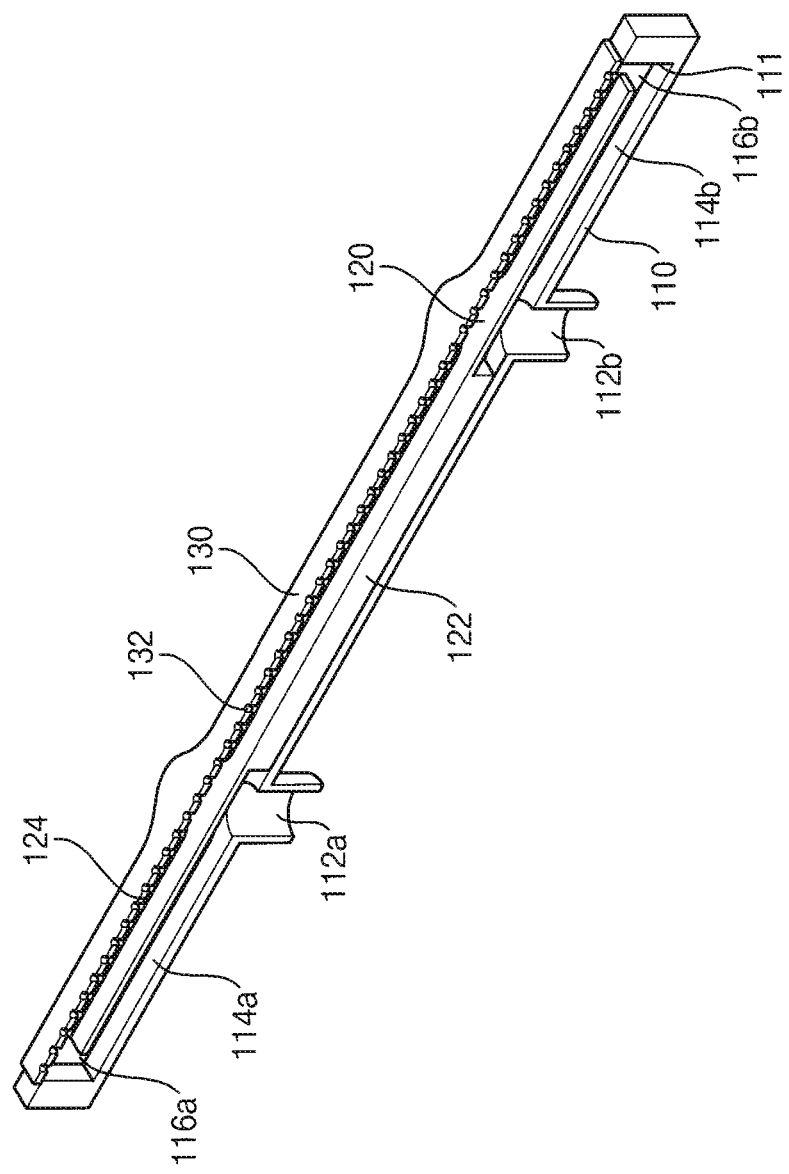
Figure 8:
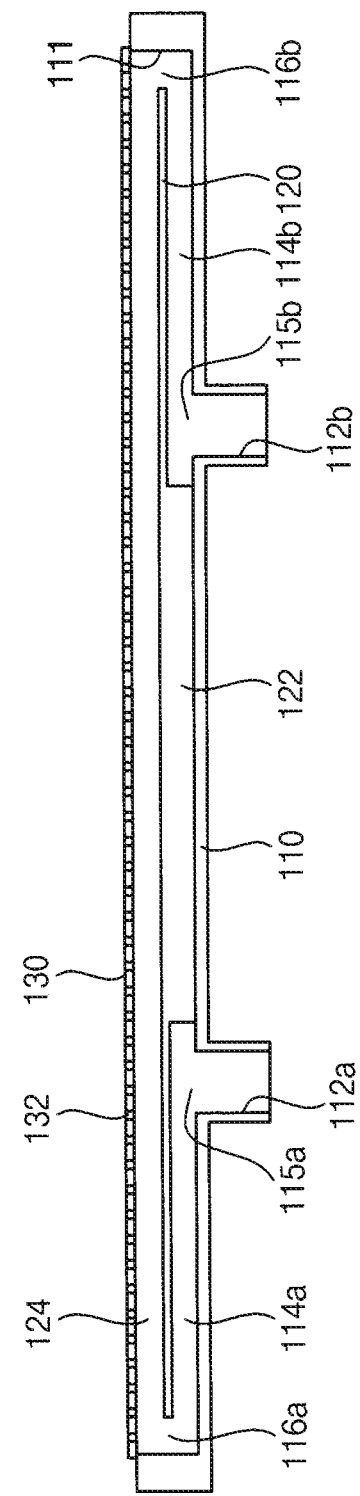
Figure 9:
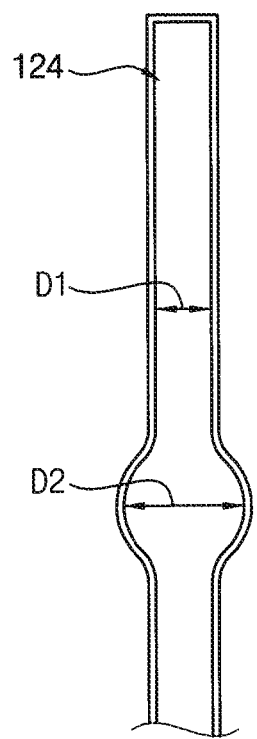
Figure 10:
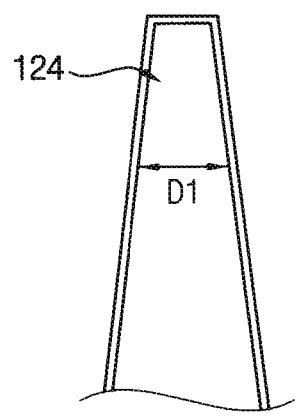

FIG. 1 is a block diagram illustrating a wafer processing apparatus in accordance with some example embodiments. FIG. 2 is a cross-sectional view illustrating a process chamber in FIG. 1. FIG. 3 is a cross-sectional view taken along the line III-III' in FIG. 2. FIG. 4 is a cross-sectional view illustrating a flow of a process gas supplied through a gas injector in FIG. 2. FIG. 5 is a perspective view illustrating the gas injector in FIG. 2. FIG. 6 is an exploded perspective view illustrating the gas injector in FIG. 5. FIG. 7 is a perspective view taken along an extending direction of the gas injector in FIG. 5. FIG. 8 is a side view illustrating the gas injector in FIG. 7. FIG. 9 is a cross-sectional view illustrating a first distribution passage of the gas injector in FIG. 5. FIG. 10 is a cross-sectional view illustrating another example of a first distribution passage.

Referring to FIGS. 1 to 10, a wafer processing apparatus 10 may include a process chamber 20 extending in a vertical direction (Z direction), a boat 30 configured to be loaded into and unloaded from the process chamber 20 and configured to support a plurality of wafers W, and a gas injector 100 configured to spray a first process gas on the wafers W in the process chamber 20. In addition, the wafer processing apparatus 10 may further include at least one spray nozzle 60 configured to spray a second process gas toward the central axis 20a of the process chamber 20 and on the wafers W in the process chamber 20. The wafer processing apparatus 10 may further include a gas supply configured to supply the first and second process gases into the process chamber 20 through the gas injector 100 and the spray nozzle 60. As shown in at least FIG. 2, the spray nozzle 60 may be adjacent to the gas injector 100.

In some example embodiments, the wafer processing apparatus 10 may include the process chamber 20 as a vertical batch reactor. The process chamber 20 may extend in the vertical direction (Z direction) to provide a space in which a plurality of the wafers W is cleaned. The process chamber 20 may be a chamber for a cleaning process to remove a native oxide layer on a surface of the wafer W. Alternatively, the process chamber 20 may be a chamber for a deposition process to forming a thin layer on a surface of the wafer W.

The substrate W may be, for example, a semiconductor wafer such as a silicon wafer or a germanium wafer. Various structures (not illustrated) may be further formed on the substrate W.

For example, a conductive layer including a metal, a metal nitride, a metal silicide, a metal oxide or the like, an electrode, or an insulation layer including silicon oxide or silicon nitride may be further formed on the substrate W. In some embodiments, an insulation layer including a hole or an opening therein may be formed on the substrate W.

A lower portion of the process chamber 20 may include a closed end, and an upper portion of the process chamber 20 may include an open end. A gate 22 may be provided in the open end of the process chamber 20. As mentioned later, the gate 22 may be connected to a transferring room (not illustrated). In addition, the process chamber 20 may be maintained at a desired temperature (that may or may not be predetermined) by a temperature control system such as a heater (not illustrated) that surrounds the process chamber 20 or a lamp heater (not illustrated) within the process chamber 20.

The process chamber 20 may receive the boat 30 that holds a plurality of the wafers W that are supported therein to be spaced apart in the vertical direction. The boat 30 may be loaded into and unloaded from the process chamber 20 through the gate 22. For example, at least 25 to 60 wafers W may be stacked in the boat 30. The boat 30 may be supported rotatably in the process chamber 20. While the boat 30 is rotated at a desired speed, process gases may be introduced on the wafers W to perform the cleaning process.

A manifold 24 for installing the gas injector 100 may be provided in a first sidewall of the process chamber 20. The manifold 24 may extend in the vertical direction (Z direction) corresponding to a shape of the gas injector 100. First and second intake ports 25a, 25b may be formed in an outer sidewall of the manifold 24. The first and second intake ports 25a, 25b may be connected to first and second introduction paths 45a, 45b through which a process gas is introduced.

In some example embodiments, the gas supply may include a first gas supply 40 configured to supply the first process gas to the gas injector 100. In addition, the gas supply may include a second gas supply 50 configured to supply the second process gas to the spray nozzle 60.

The first gas supply 40 may include a first gas supply source 42, a first gas supplying path 43, a microwave exciting unit 44 and a first gas introduction path 45. For example, the first gas supply source 42 may supply an ammonia ($NH_3$) gas and a nitrogen ($N_2$) gas as a carrier gas. The microwave exciting unit 44 may apply a microwave to the ammonia gas introduced via the first gas supplying path 43 to excite the ammonia gas, to excite a hydrogen gas to a plasma state and generate a hydrogen radical (H*). The generated hydrogen radicals (H*) may be introduced into the process chamber 20 through the gas injector 100 installed in the manifold 24. Accordingly, the first gas supply 40 will be understood to be configured to supply a hydrogen radical to at least a gas introduction passage (e.g., the first gas introduction passage 112a) of the gas injector 100.

As illustrated in FIGS. 2 and 4, the microwave exciting unit 44 may include a first exciting portion 44a and a second exciting portion 44b, and the first gas introduction path 45 may include a first introduction path 45a connected to the first exciting portion 44a and a second introduction path 45b connected to the second exciting portion 44b. The first introduction path 45a may be connected to the first intake port 25a formed in the manifold 24 and the second introduction path 45b may be connected to the second intake port 25b formed in the manifold 24.

The ammonia gas from the first gas supply source 42 may be introduced into the first and second exciting portions 44a, 44b through first and second supplying paths 43a and 43b branched off from the first gas supplying path 43. The hydrogen radical (H*) generated by the first exciting portion 44a may be supplied to a first gas introduction passage 112a of the gas injector 100 through the first introduction path 45a. The hydrogen radical (H*) generated by the second exciting portion 44b may be supplied to a second gas introduction passage 112b of the gas injector 100 through the second introduction path 45b.

Although it is not illustrated in the figures, a mass flow controller (MFC) may be installed in each of the first supplying path and the second supplying path to control a flow rate of the ammonia gas. Accordingly, the flow rate of the ammonia gas supplied to each of the first exciting portion 44a and the second exciting portion 44b may be controlled.

In some example embodiments, the first exciting portion 44a may apply a microwave of a first power to the introduced ammonia gas, and the second exciting portion 44b may apply a microwave of a second power different from the first power to the introduced ammonia gas. Accordingly, a concentration of the hydrogen radical (H*) supplied to each of the first and second gas introduction passages 112a, 112b of the gas injector 100 may be controlled. As described herein, a gas introduction passage 112, 112a, 112b may be referred to as a gas introduction "tube".

In some example embodiments, the gas injector 100 may be installed in an inner wall of the manifold 24 of the process chamber 20 to extend in the vertical direction (Z direction) to spray the hydrogen radical (H*) as the first process gas toward a central axis 20a of the process chamber 20. The gas injector 100 may include the first and second introduction passages 112a, 112b, first and second bypass passages 114a, 114b, a distribution passage 124, and a plurality of spray holes 132. As shown in at least FIGS. 2 and 4, the spray holes 132 may be spaced apart from each other along an extending direction (e.g., the Z direction) of the distribution passage 124.

In particular, the first and second gas introduction passages 112a, 112b may extend in a first direction (Y direction) toward the central axis 20a of the process chamber 20, respectively. The first and second gas introduction passages 112a, 112b may be spaced apart from each other along a second direction (Z direction) perpendicular to the first direction (Y direction). The first gas introduction passage 112a may be arranged to be positioned relatively higher than the second gas introduction passage 112b in the second direction (Z direction). The first and second gas introduction passages 112a, 112b may be connected to an inner space of the gas injector 100 at a middle region in the second direction (Z direction).

The first and second gas introduction passages 112a, 112b may be connected to the first and second intake ports 25a, 25b, respectively. The hydrogen radicals (H*) generated by the first and second exciting portions 44a, 44b may be supplied to the first and second gas introduction passages 112a, 112b, respectively. Accordingly, as shown in at least FIGS. 1-4, each gas introduction passage of the first and second gas introduction passages 112a, 112b may be configured to direct ("supply") a process gas from a gas supply source (e.g., first gas supply source 42, second gas supply source 52, or first and second gas supply sources 42 and 52).

The first bypass passage 114a may extend in the second direction (Z direction) from the first gas introduction passage 112a toward the upper portion of the process chamber 20. The second bypass passage 114b may extend in a reverse direction (-Z direction) to the second direction from the second gas introduction passage 112b toward the lower portion of the process chamber 20. The first bypass passage 114a and the second bypass passage 114b may be spaced apart from each other along the second direction (Z direction). The second direction (Z direction) may be perpendicular or substantially perpendicular (e.g., perpendicular within manufacturing tolerances and/or material tolerances) to a first direction (Y direction) along which the first and second gas introduction passages 112a, 112b extend. The first and second bypass passages 114a, 114b may be spaced apart from a sidewall of the process chamber 20, that is, the manifold 24 toward the central axis 20a of the process chamber 20 by a same first distance, respectively.

The distribution passage 124 may be arranged to be spaced apart ("isolated") from the first and second bypass passages 114a, 114b in the first direction (Y direction). The distribution passage 124 may extend from an outlet 116a of the first bypass passage 114a to an outlet 116b of the second bypass passage 114b. The distribution passage 124 may include a first distribution passage 124a extending from the outlet 116a of the first bypass passage 114a in the reverse direction (-Z direction) to the second direction and a second distribution passage 124b extending from the outlet 116b of the second bypass passage 114b in the second direction (Z direction). The first distribution passage and the second distribution passage may be connected to each other to form the distribution passage 124. The distribution passage 124 may be spaced apart from ("isolated from") the sidewall of the process chamber 20, that is, the manifold 24 toward the central axis 20a of the process chamber 20 by a second distant greater than the first distance.

A plurality of the spray holes 132 may be formed in an outer wall of the distribution passage 124 toward the central axis 20a of the process chamber 20 to be spaced apart from each other along the second direction (Z direction). Thus, the spray holes 132 may be in an outer surface of the first and second distribution passages 124a, 124b. The spray holes 132 may be configured to spray the process gas directed through the gas injector 100 from one or more gas supply sources. The spray holes 132 may be arranged corresponding to the wafers W which are arranged to be stacked in the boat 30 within the process chamber 20.

In some example embodiments, the gas injector 100 may include a compensation plate 120 arranged to extend in the second direction (Z direction) within the inner space thereof. The compensation plate 120 may extend within the inner space of the gas injector 100 in the second direction (Z direction). The compensation plate 120 may be spaced from ("isolated from direct contact with") a base plate 110 of the gas injector 100 to define the first and second bypass passages 114a, 114b. The compensation plate 120 may be spaced apart from a distribution plate 130 of the gas injector 100 to define the distribution passage 124. The compensation plate 120 may be between the first bypass passage 114a and the first distribution passage 124a and may further be between the second bypass passage 114b and the second distribution passage 124b.

Accordingly, the gas injector may not directly supply the first process gas from the first gas supply 40 toward the central axis 20a of the process chamber 20, and may flow the first process gas toward the upper portion and the lower portion of the process chamber through the first bypass passage 114a and the second bypass passage 114b, respectively, and supply uniformly toward the central axis 20a of the process chamber 20 through the spray holes 132 formed in the outer wall of the distribution passage 124.

While the first process gas flows in the extending direction of the distribution passage 124 along the compensation plate 120, the first process gas may be thermally compensated by the compensation plate 120 having relatively high temperature, to thereby provide uniform temperature and flow rates between the spray holes 132 along the vertical direction.

In some example embodiments, the spray nozzle 60 may be arranged adjacent to the gas injector 100 within the process chamber 20 to extend along the vertical direction (Z direction). The spray nozzle 60 may extend from the upper portion to the lower portion of the process chamber 20. The spray nozzle 60 may include a plurality of spray holes 62 which are spaced apart from each other along an extending direction of the spray nozzle 60 and configured to spray the second process gas.

The second gas supply 50 may include a second gas supply source 52 and a second gas introduction path 53. For example, the second gas supply source 52 may supply a nitrogen fluoride ($NF_3$) gas. The nitrogen fluoride gas from the second gas supply source 52 may be supplied to the spray nozzle 60 through the second gas introduction path 53.

Although it is not illustrated in the figures, a mass flow controller may be installed in the second gas introduction path 53 to control a flow rate of the nitrogen fluoride gas. Accordingly, the flow rate of the nitrogen fluoride gas supplied to the spray nozzle 60 may be controlled.

As illustrated in FIG. 4, the nitrogen fluoride gas supplied from the spray nozzle 60 and the hydrogen radical supplied from the gas injector 100 may be mixed and reacted with each other to generate an ammonium fluoride ($NH_xF_y$) gas. The ammonium fluoride may react with the native oxide layer on the surface of the substrate W, and thus, may be converted into volatile ammonium fluorosilicate and may be removed. Accordingly, it will be understood that a hydrogen radical may be supplied to remove a native oxide layer on a surface of a wafer loaded into the process chamber 20.

In some example embodiments, the wafer processing apparatus 10 may include an exhaust portion 70 configured to exhaust a gas within the process chamber 20.

An exhaust port 26 may be provided in a second wall opposite to the first sidewall of the process chamber 20. An exhaust pump P such as a dry pump or a turbo molecular pump may be connected to the exhaust port 26. Accordingly, the gas within the process chamber 20 may be exhausted to the outside through the exhaust portion 70 connected to the interior of the process chamber 20.

Hereinafter, the gas injector will be explained in detail.

Referring to FIGS. 5 to 9, the gas injector 100 may include the base plate 110, the compensation plate 120 and the distribution plate 130.

The base plate 110 may have a shape extending in the second direction along the sidewall of the process chamber 20, that is, the manifold 24. The first and second gas introduction passages 112a, 112b may be formed in an outer wall of the base plate 110 facing the sidewall of the manifold 24. The first and second gas introduction passages 112a, 112b may extend in the first direction perpendicular to the second direction, respectively, such that each gas introduction passage of the first and second gas introduction passages 112a, 112b extent in the first direction (e.g., Y direction) toward a central axis 20a of the process chamber 20.

A recess 111 for forming the first and second bypass passages 114a, 114b and the distribution passage 124 may be formed in an inner wall of the base plate 110. The recess may extend in the second direction. The first and second gas introduction passages 112a, 112b may be connected to a bottom surface of the recess 111.

The compensation plate 120 serving as a temperature compensation plate may be installed fixedly within the recess 111. The compensation plate 120 may be spaced apart from an inner wall of the base plate 110 to define the first and second bypass passages 114a, 114b. The first gas introduction passage 112a may be connected to an inlet 115a of the first bypass passage 114a. The second gas introduction passage 112b may be connected to an inlet 115b of the second bypass passage 114b. The second bypass passage 114b may extend in a reverse direction to the second direction.

The compensation plate 120 may include a blocking member 122 which is arranged on the base plate 110 between the first and second gas introduction passages 112a, 112b. The first and second bypass passages 114a, 114b may be separated by the blocking member 122.

The distribution plate 130 may be fixed on the base plate 110 to cover the recess 111. The distribution plate 130 may be spaced apart from the compensation plate 120 to form the distribution passage 124. The distribution passage 124 may extend from the outlet 116a of the first bypass passage 114a to the outlet 116b of the second bypass passage 114b. The distribution passage 124 may include the first distribution passage extending from the outlet 116a of the first bypass passage 114a in the reverse direction to the second direction and the second distribution passage extending from the outlet 116b of the second bypass passage 114b in the second direction. As shown in at least FIG. 4, the first distribution passage 124a and the second distribution passage 124b may be connected to each other to form the distribution passage 124.

A plurality of the spray holes 132 may be formed in the distribution passage 124 to be spaced apart from each other along the second direction. For example, the spray hole may have a shape such as a circle, an oval or a polygon. A size of the spray hole may be changed according to a position in the extending direction.

For example, the base plate 110, the compensation plate 120 and the distribution plate 130 may include quartz, stainless steel, metal alloy, a sub-combination thereof, or a combination thereof. The compensation plate 120 may include quartz, metal such as aluminum, a sub-combination thereof, or a combination thereof.

As illustrated in FIG. 9, the distribution passage 124 may have different diameters at different positions along the second direction. For example, a first portion of the distribution passage 124 which is a first distance away from the outlet 116a of the first bypass passage 114a may have a first diameter D1, and a second portion of the distribution passage 124 which is a second distance greater than the first distance away from the outlet 116a may have a second diameter D2 greater than the first diameter D1.

A thickness T of the compensation plate 120 as the temperature compensation plate may define a spacing distance between the first bypass passage 114a as an outer passage and the distribution passage as an inner passage. The thickness and the material of the compensation plate 120 may be determined in consideration of a temperature profile of the first process gas along the extending direction of the gas injector.

As illustrated in FIG. 10, a sectional area of the distribution passage 124 may be increased or decreased along the second direction. For example, the farther away from the outlet 116a of the first bypass passage 114a, the greater the sectional area of the distribution passage 124 is. Restated, as shown in FIG. 10, the sectional area of the distribution passage 124 may be proportional to a distance along the distribution passage 124 from the outlet 116a of the first bypass passage 114a. Although it is not illustrated in the figure, the farther away from the outlet 116b of the second bypass passage 114b, the greater the sectional area of the distribution passage 124 is. Restated, the sectional area of the distribution passage 124 may be proportional to a distance along the distribution passage 124 from the outlet 116b of the second bypass passage 114b. Additionally, a middle portion of the distribution passage 124 may have a uniform sectional area.

Figure 11A:
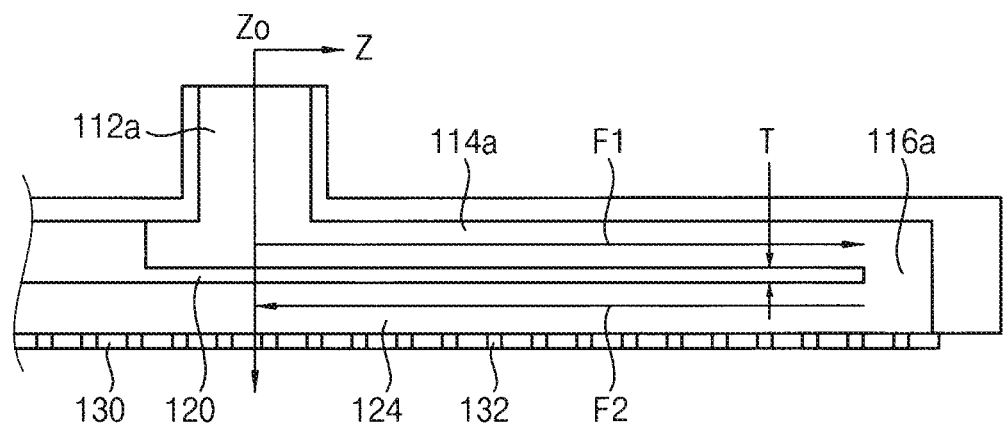
FIG. 11A is a cross-sectional view illustrating a flow of the first process gas in the gas injector.
Figure 11B:
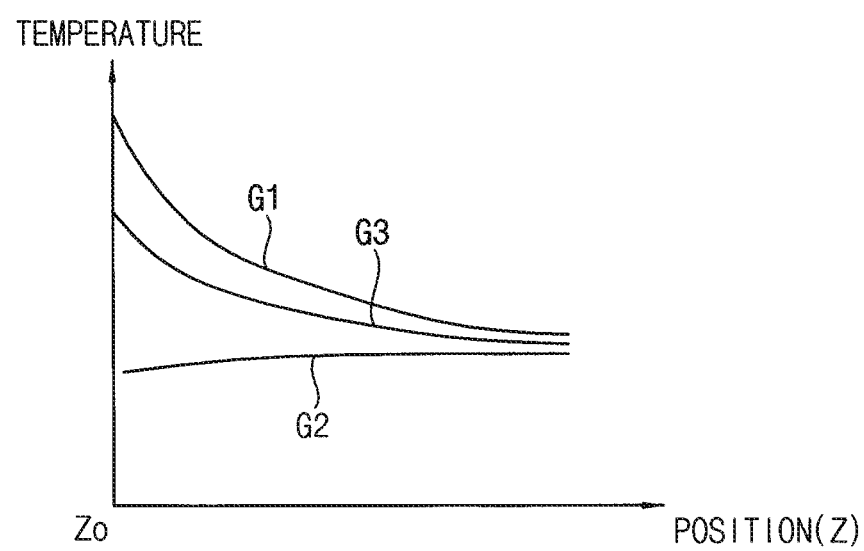
FIG. 11B is a graph illustrating a temperature change in the first process gas in FIG. 11A.

FIG. 11A is a cross-sectional view illustrating a flow of the first process gas in the gas injector, and FIG. 11B is a graph illustrating a temperature change in the first process gas in FIG. 11A.

Referring to FIGS. 11A and 11B, the first process gas F1 flowing through the first bypass passage 114a may move toward the upper portion of the gas injector in Z direction, and then, the first process gas F2 flowing through the distribution passage 124 may move toward the middle portion of the gas injector in −Z direction. Graph G1 represents a temperature change in the first process gas F1 flowing through the first bypass passage 114a, graph G2 represents a temperature change in the first process gas F2 flowing through the distribution passage 124, and graph G3 represents a temperature change in the compensation plate 120.

The temperature of the first process gas F1 flowing through the first bypass passage 114a may be gradually decreased as it gets closer to the upper portion of the gas injector in Z direction, and the temperature of the compensation plate 120 may be gradually decreased due to the effect of the first process gas F1 as it gets closer to the upper portion of the gas injector in Z direction. The first process gas F2 flowing through the distribution passage 124 may be thermally compensated by the compensation plate 120 having relatively high temperature to be maintained at a desired temperature. Accordingly, the first process gas sprayed out from the spray holes 132 along the distribution passage 124 may have a uniform temperature distribution along Z direction.

Figure 12:
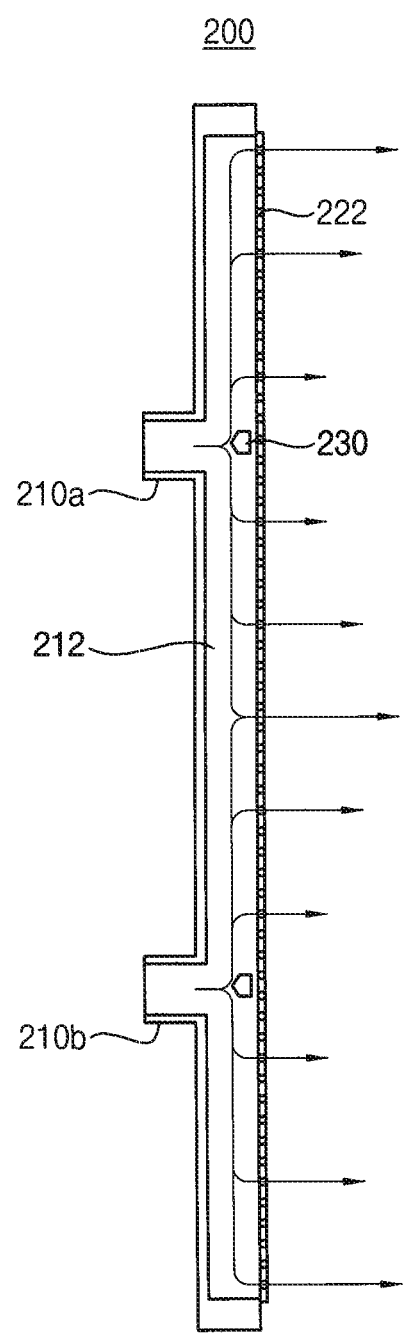

FIG. 12 is a cross-sectional view illustrating a gas injector in accordance with comparative embodiments.

Referring to FIG. 12, a gas injector 200 according to comparative embodiments may include first and second gas introduction passages 210a, 210b, a nozzle passage 212 connected to the first and second gas introduction passages 210a, 210b and a plurality of spray holes 222 formed in an outer wall of the nozzle passage 212. Additionally, the gas injector 200 may include diffusers 230 which are arranged corresponding to the first and second gas introduction passages 210a, 210b respectively to diffuse a process gas.

Figure 13:
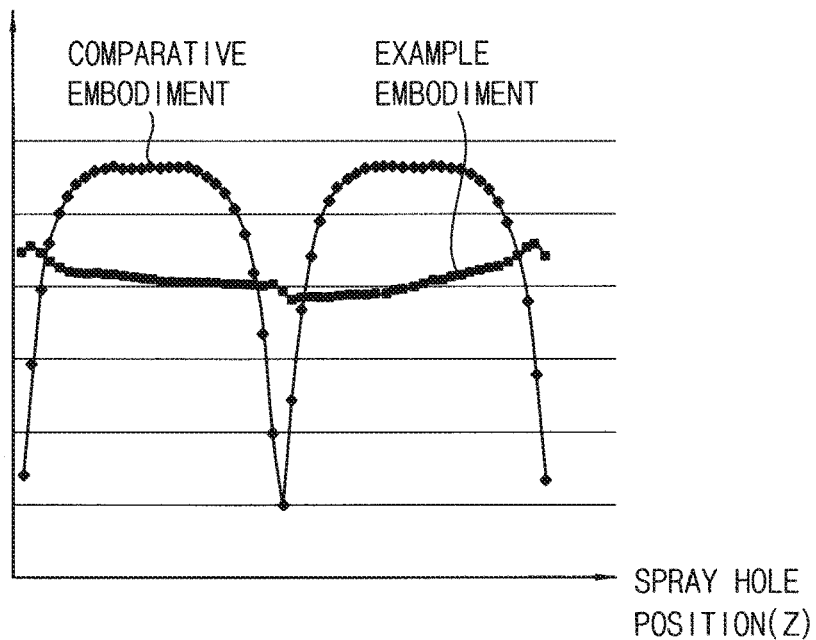
Figure 14:
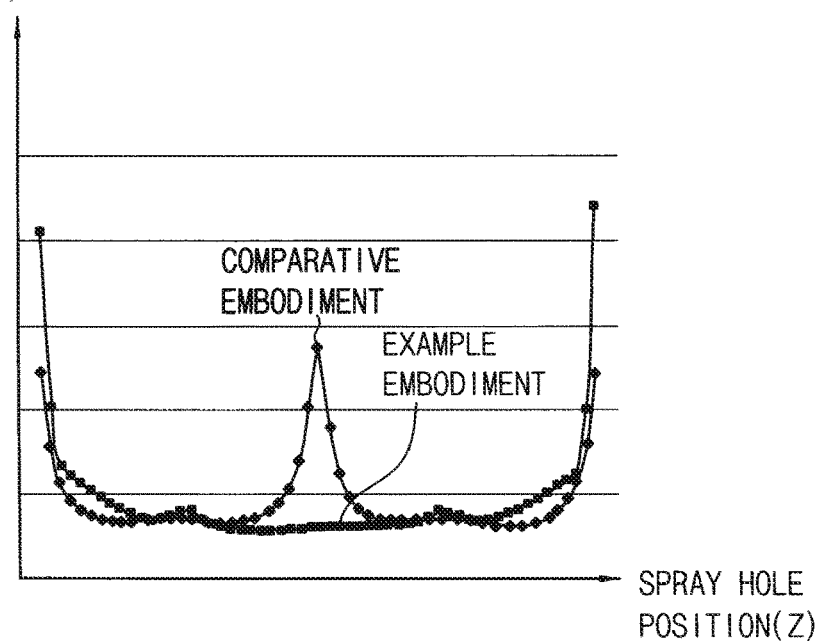

FIG. 13 is a graph illustrating a temperature profile of a process gas along an extending direction, which is sprayed by the gas injector in FIG. 5 and the gas injector in FIG. 12 respectively. FIG. 14 is a graph illustrating a flow rate profile of a process gas along an extending direction, which is sprayed by the gas injector in FIG. 5 and the gas injector in FIG. 12 respectively.

Referring to FIGS. 13 and 14, the gas injector in FIG. 5 as a return type shower head may provide uniform temperature distribution and flow rate distribution than the gas injector in FIG. 12.

Figure 15:
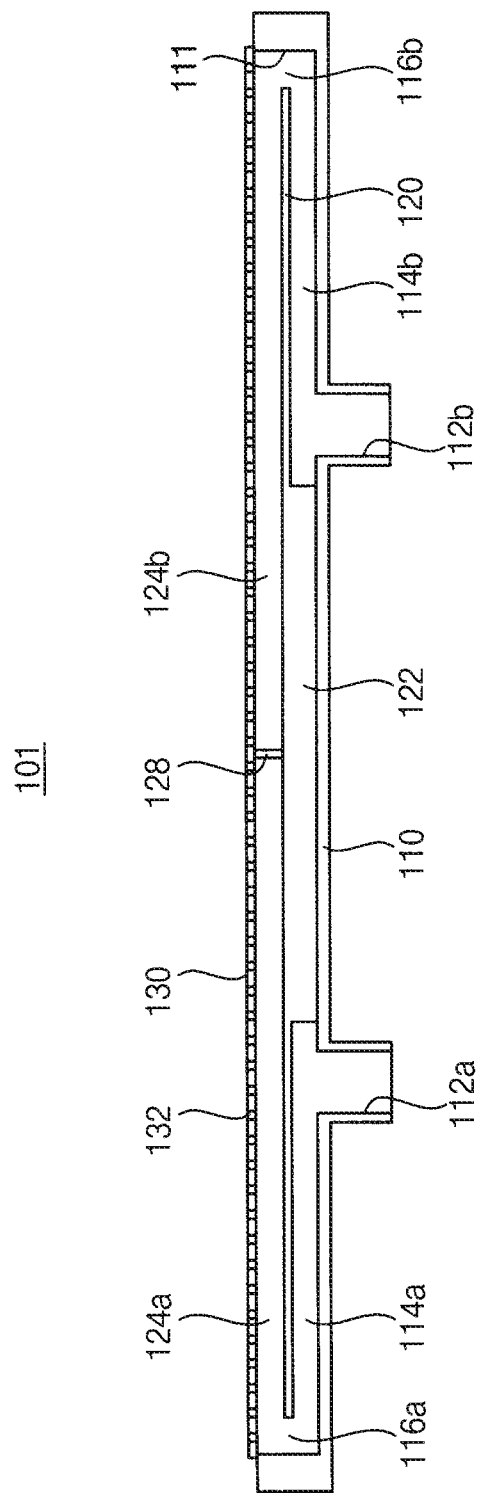

FIG. 15 is a cross-sectional view illustrating a gas injector in accordance with some example embodiments. The gas injector may be substantially the same as (e.g., the same within manufacturing tolerances and/or material tolerances) or similar to the gas injector described with reference to FIG. 5, except for a shape of a distribution passage. Thus, same reference numerals will be used to refer to the same or like elements as those described in the gas injector described with reference to FIG. 5, and any further repetitive explanation concerning the above elements will be omitted.

Referring to FIG. 15, a gas injector 101 may include first and second gas introduction passages 112a, 112b, first and second bypass passages 114a, 114b, first and second distribution passages 124a, 124b, and a plurality of spray holes 132. The gas injector 101 may include a blocking plate 128 between the first and second distribution passages 124a, 124b.

The first bypass passage 114a may extend from the first gas introduction passage 112a in a second direction. The first distribution passage 124a may extend from an outlet 116a of the first bypass passage 114a in a reverse direction to the second direction. The second bypass passage 114b may extend from the second gas introduction passage 112b in the reverse direction to the second direction. The second distribution passage 124b may extend from an outlet 116b of the second bypass passage 114b in the second direction. A plurality of the spray holes 132 may be formed in the first and second distribution passages 124a, 124b to be spaced apart from each other in the second direction.

The first and second distribution passages 124a, 124b may be separated by the blocking plate 128. For example, as shown in FIG. 15, a length of the first distribution passage 124a may be the same or substantially the same as (e.g., the same within manufacturing tolerances and/or material tolerances) a length of the second distribution passage 124b. As further shown in FIG. 15, a length of the first distribution passage 124a may be greater than a length of the first bypass passage 114a and a length of the second distribution passage 124b may be greater than a length of the second bypass passage 114b.

Figure 16:
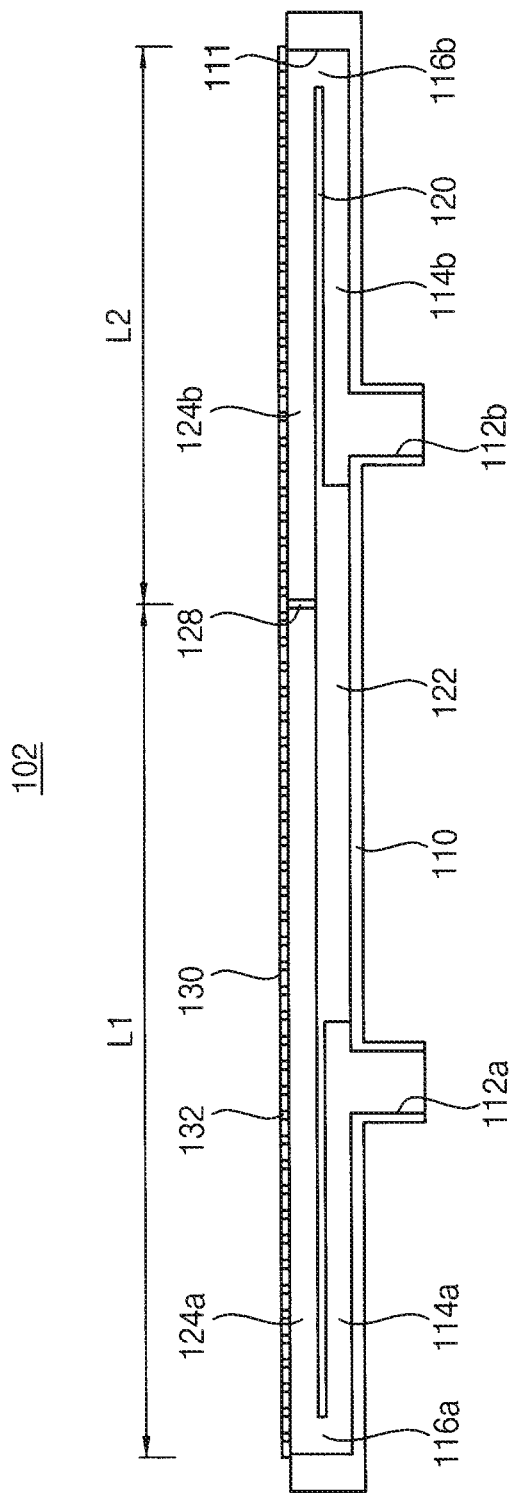

FIG. 16 is a cross-sectional view illustrating a gas injector in accordance with some example embodiments. The gas injector may be substantially the same as (e.g., the same within manufacturing tolerances and/or material tolerances) or similar to the gas injector described with reference to FIG. 15, except for lengths of first and second distribution passages. Thus, same reference numerals will be used to refer to the same or like elements as those described in the gas injector described with reference to FIG. 15, and any further repetitive explanation concerning the above elements will be omitted.

Referring to FIG. 16, a gas injector 102 may include first and second distribution passages 124a, 124b separated by a blocking plate 128. As shown in at least FIG. 16, a length of the first distribution passage 124a may be different from a length of the second distribution passage 124b.

For example, as shown in FIG. 16, a length L1 of the first distribution passage 124a may be greater than a length L2 of the second distribution passage 124b.

In this case, the first exciting portion 44a of the microwave exciting unit 44 in FIGS. 1 and 4 may apply a microwave of a first power to an introduced ammonia gas, and the second exciting portion 44b may apply a microwave of a second power different from the first power to the introduced ammonia gas. Accordingly, a concentration of the hydrogen radical (H*) sprayed out through each of the first and second distribution passages 124a, 124b may be controlled.

Figure 17:
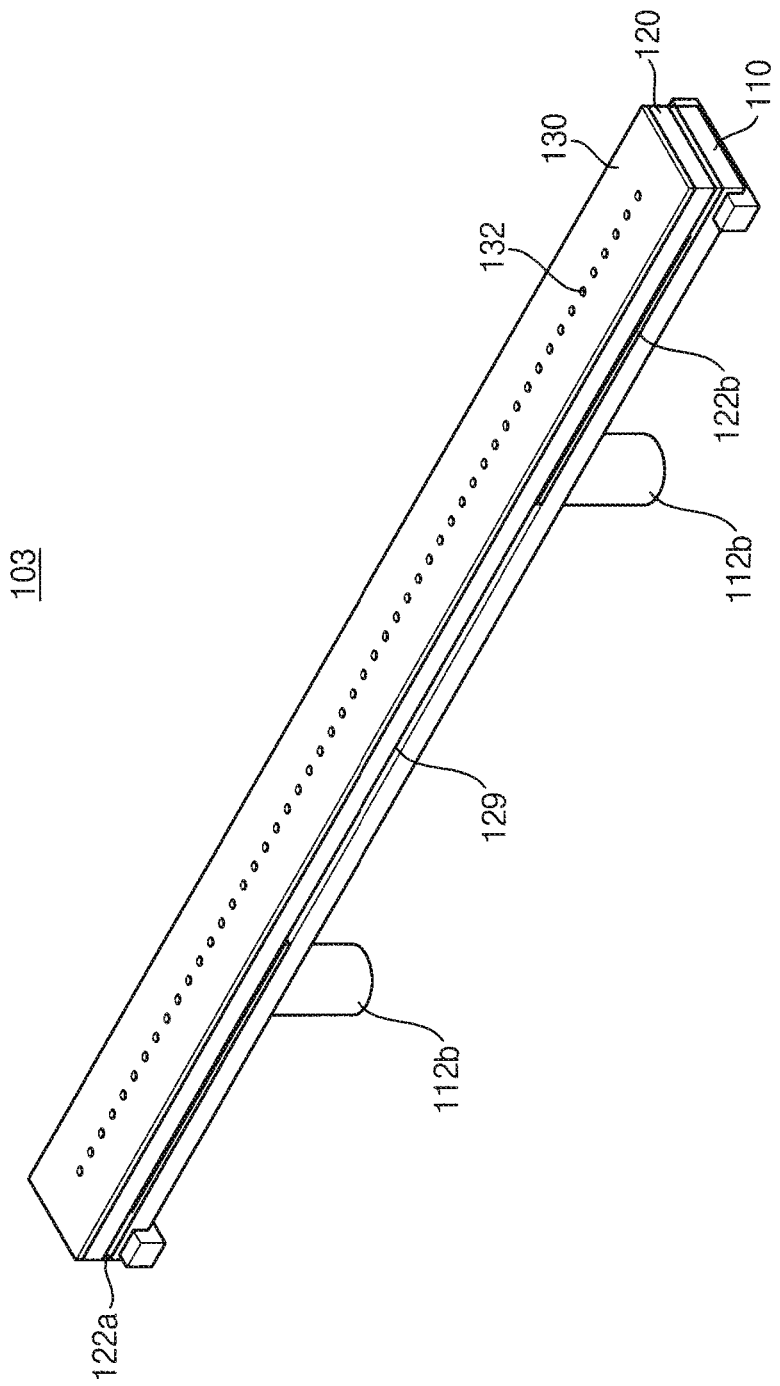
Figure 18:
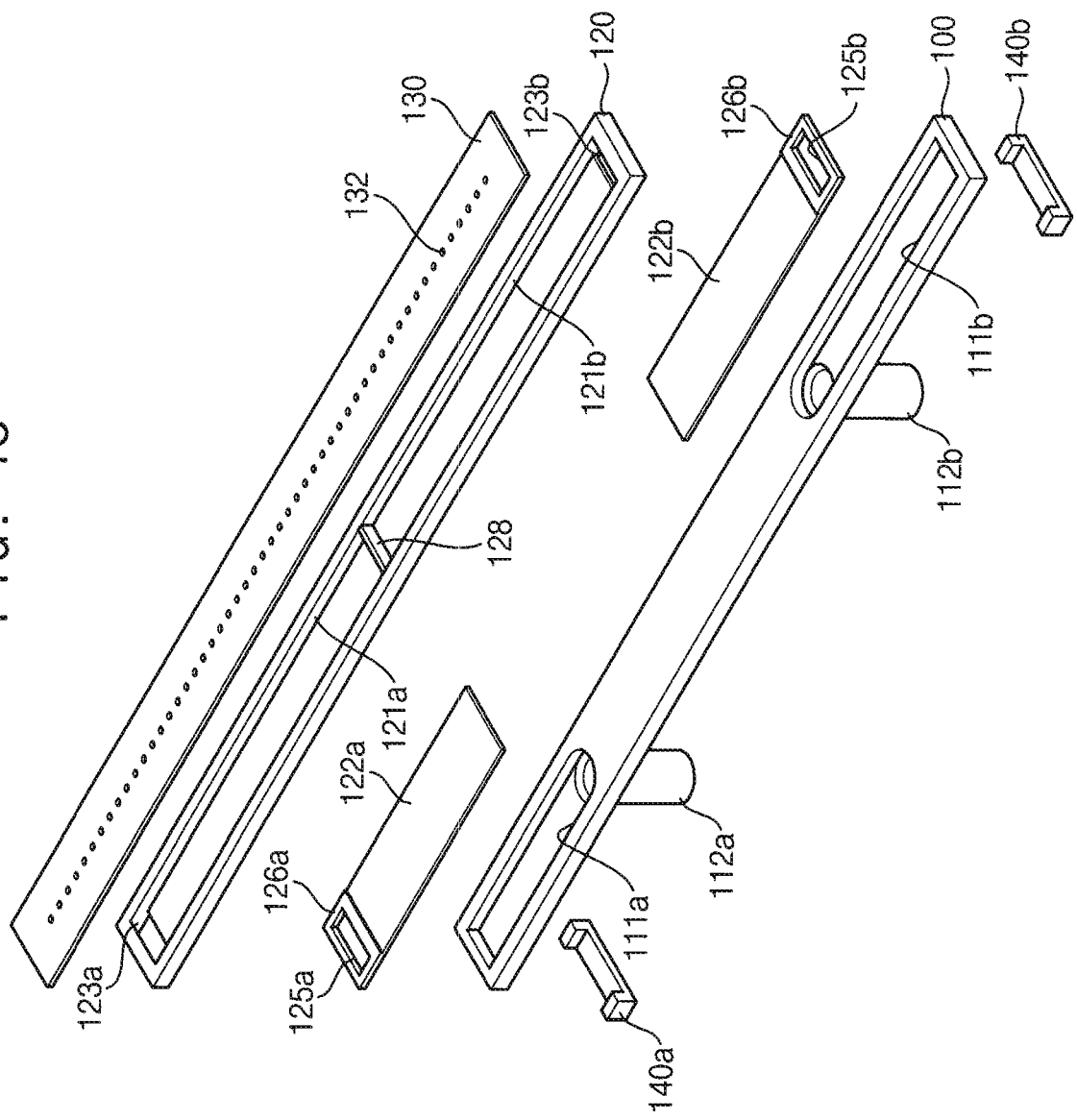
Figure 19:
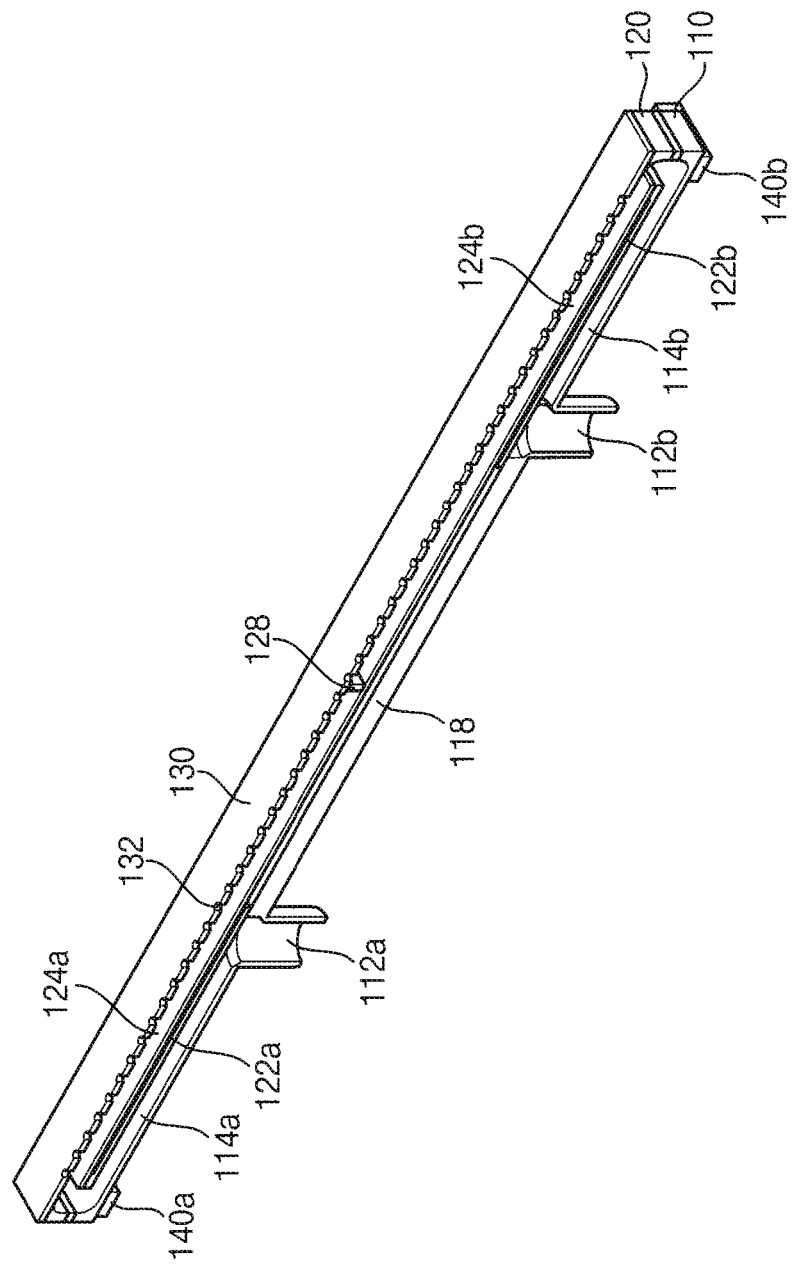
Figure 20:
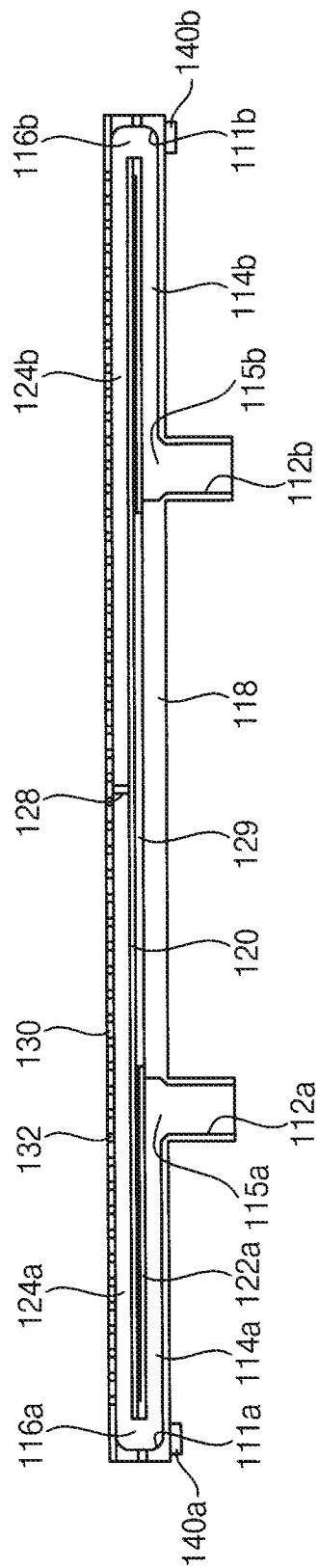
Figure 21:
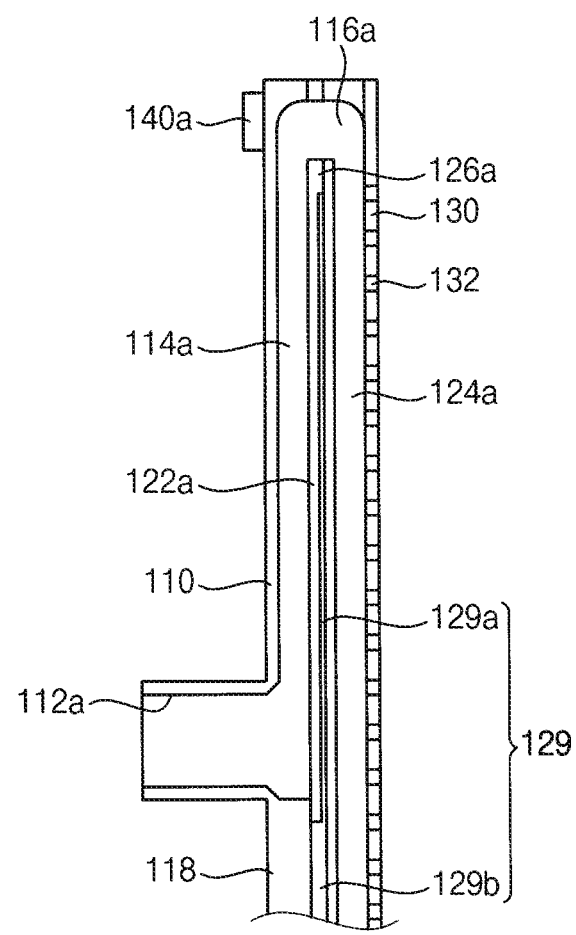

FIG. 17 is a perspective view illustrating a gas injector in accordance with some example embodiments. FIG. 18 is an exploded perspective view illustrating the gas injector in FIG. 17. FIG. 19 is a perspective view taken along an extending direction of the gas injector in FIG. 17. FIG. 20 is a side view illustrating the gas injector in FIG. 19. FIG. 21 is an enlarged cross-sectional view illustrating a first bypass passage and a first distribution passage of the gas injector in FIG. 17. The gas injector may be substantially the same as (e.g., the same within manufacturing tolerances and/or material tolerances) or similar to the gas injector described with reference to FIG. 5, except for a shape of a compensation plate. Thus, same reference numerals will be used to refer to the same or like elements as those described in the gas injector described with reference to FIG. 5, and any further repetitive explanation concerning the above elements will be omitted.

Referring to FIGS. 17 to 21, a gas injector 103 may include a base plate 110, a compensation plate 120, first and second guide plates 122a, 122b and a distribution plate 130.

The base plate 110 may have a shape extending in a second direction. First and second gas introduction passages 112a, 112b may be formed in an outer wall of the base plate 110. The first and second gas introduction passages 112a, 112b may extend in a first direction perpendicular to the second direction, respectively.

First and second recesses 111a, 111b for forming first and second bypass passages 114a, 114b may be formed in an inner wall of the base plate 110. The first and second recesses 111a, 111b may be spaced apart from each other along the second direction. The first and second recesses 111a, 111b may extend in the second direction, respectively. The first gas introduction passage 112a may be connected to a bottom surface of the first recess 111a. The second gas introduction passage 112b may be connected to a bottom surface of the second recess 111b.

A blocking member 118 may be formed to protrude from the inner wall of the base plate 110 between the first and second gas introduction passages 112a, 112b. The first and second recesses 111a, 111b may be separated by the blocking member 118.

The first guide plate 122a may be fixed on the base plate 110 to cover the first recess 111a, and the second guide plate 122b may be fixed on the base plate 110 to cover the second recess 111b. The first guide plate 122a may be spaced apart from the inner wall of the base plate 110 to define the first bypass passage 114a, and the second guide plate 122b may be spaced apart from the inner wall of the base plate 110 to define the second bypass passage 114b. The first gas introduction passage 112a may be connected to an inlet 115a of the first bypass passage 114a. The first bypass passage 114a may extend in the second direction. The second gas introduction passage 112b may be connected to an inlet 115b of the second bypass passage 114b. The second bypass passage 114b may extend in the second direction.

The first guide plate 122a may include a first gap protruding portion 126a protruding from an outer surface of the first guide plate 122a. The first gap protruding portion 126a may be formed to surround a first through hole 125a which is formed in an end portion of the first guide plate 122a. The second guide plate 122b may include a second gap protruding portion 126b protruding from an outer surface of the second guide plate 122b. The second gap protruding portion 126b may be formed to surround a second through hole 125b which is formed in an end portion of the second guide plate 122b.

The compensation plate 120 may be installed fixedly on the base plate 110 with the first and second guide plates 122a, 122b interposed therebetween. The compensation plate 120 may extend in the second direction. Third and fourth recesses for forming first and second distribution passages 124a, 124b may be formed in an inner wall of the compensation plate 120. The third and fourth recesses 121a, 121b may be separated by a blocking plate 128.

Third and fourth through holes 123a, 123b may be formed in both end portions of the compensation plate 120 to be connected to the first and second through holes 125a, 125b respectively to form outlets 116a, 116b of the first and second bypass passages 114a, 114b.

In some example embodiments, the first and second guide plates 122a, 122b may be formed on an outer wall of the compensation plate 120 to form a temperature compensation plate. The first and second guide plates 122a, 122b may be formed integrally with the outer wall of the compensation plate 120. Accordingly, the temperature compensation plate may include a gap 129 extending in one direction therein.

In particular, a first gap 129a may be formed between the first guide plate 122a and the compensation plate 120 by the first gap protruding portion 126a, and a second gap may be formed between the second guide plate 122b and the compensation plate 120. The first and second gaps may extend in the second direction, respectively.

Additionally, a middle gap 129b may be formed between the base plate 110 and the compensation plate 120. The middle gap 129b may extend between the first and second guide plates 122a, 122b in the second direction.

Extending lengths, thicknesses, widths, etc. of the gaps 129, 129a, 129b in the temperature compensation plate may be determined in consideration of a temperature profile of a first process gas along the extending direction of the gas injector. The gap 129 may be understood to comprise an internal gap of the compensation plate 120.

The distribution plate 130 may be fixed on the compensation plate 120 to cover the third and fourth recesses 121a, 121b. The distribution plate 130 may be spaced apart from the compensation plate 120 to form the first and second distribution passages 124a, 124b. The first distribution passage 124a may extend from the outlet 116a of the first bypass passage 114a in the reverse direction to the second direction. The second distribution passage 124b may extend from the outlet 116b of the second bypass passage 114b in the second direction.

A plurality of the spray holes 132 may be formed in the first and second distribution passages 124a, 124b to be spaced apart from each other along the second direction.

The gas injector 103 may further include first and second fixing plates 140a, 140b for fastening the base plate 110 on a sidewall of a process chamber 20, that is, a manifold 24.

Figure 22:
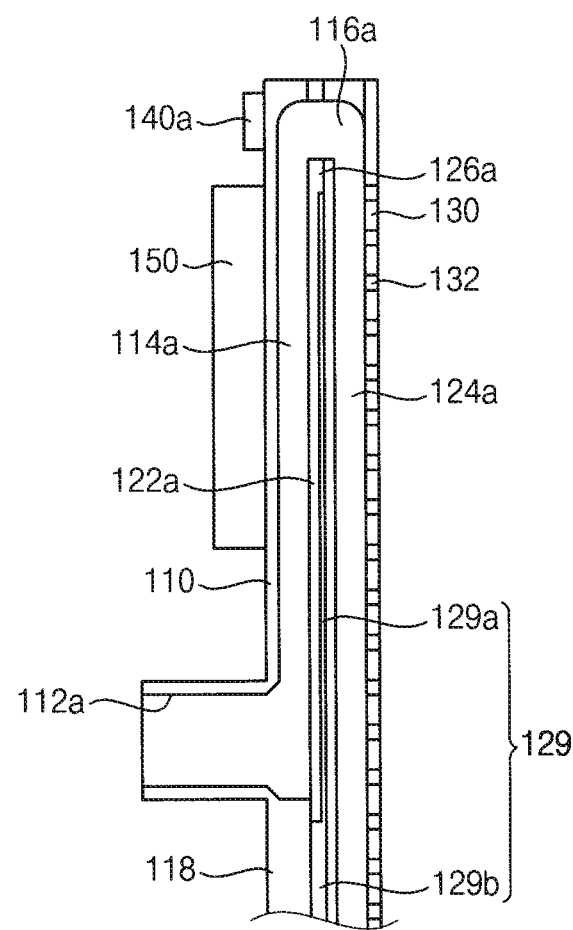

FIG. 22 is a cross-sectional view illustrating a gas injector in accordance with some example embodiments. The gas injector may be substantially the same as (e.g., the same within manufacturing tolerances and/or material tolerances) or similar to the gas injector described with reference to FIG. 17, except for an additional heat capacity member. Thus, same reference numerals will be used to refer to the same or like elements as those described in the gas injector described with reference to FIG. 17, and any further repetitive explanation concerning the above elements will be omitted.

Referring to FIG. 22, a gas injector may further include a heat capacity member 150 provided on an outer surface thereof.

For example, the heat capacity member 150 may be provided on an outer wall of a base plate 110 to have a particular (or, alternatively, predetermined) thickness, to reduce a temperature change of the base plate 110. The heat capacity member 150 may be formed integrally with the outer wall of the base plate 110.

Figure 23:
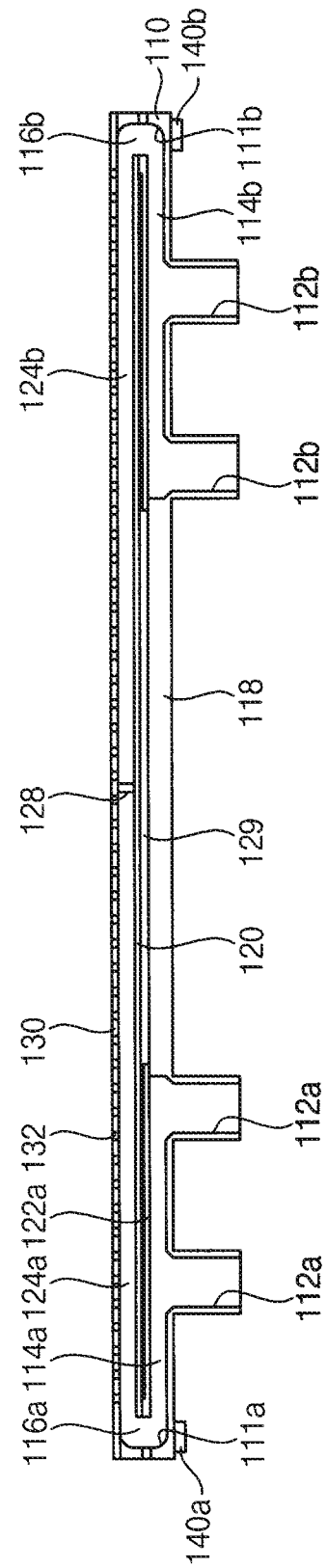

FIG. 23 is a cross-sectional view illustrating a gas injector in accordance with some example embodiments. The gas injector may be substantially the same as (e.g., the same within manufacturing tolerances and/or material tolerances) or similar to the gas injector described with reference to FIG. 17, except for the number of first and second gas introduction passages. Thus, same reference numerals will be used to refer to the same or like elements as those described in the gas injector described with reference to FIG. 17, and any further repetitive explanation concerning the above elements will be omitted.

Referring to FIG. 23, a base plate 110 of a gas injector 104 may include two first gas introduction passages 112a and two second gas introduction passages 112b. A first bypass passage 114a may be connected to two first gas introduction passages 112a, and a second bypass passage 114b may be connected to two second gas introduction passages 112b.

Accordingly, a flow rate of a process gas supplied to each of the first and second bypass passages 114a, 114b may be controlled.

Alternatively, the number of the first gas introduction passages 112a may be different from the number of the second gas introduction passages 112b. For example, the base plate 110 of the gas injector may include two first gas introduction passages 112a and one second gas introduction passages 112b.

Figure 24:
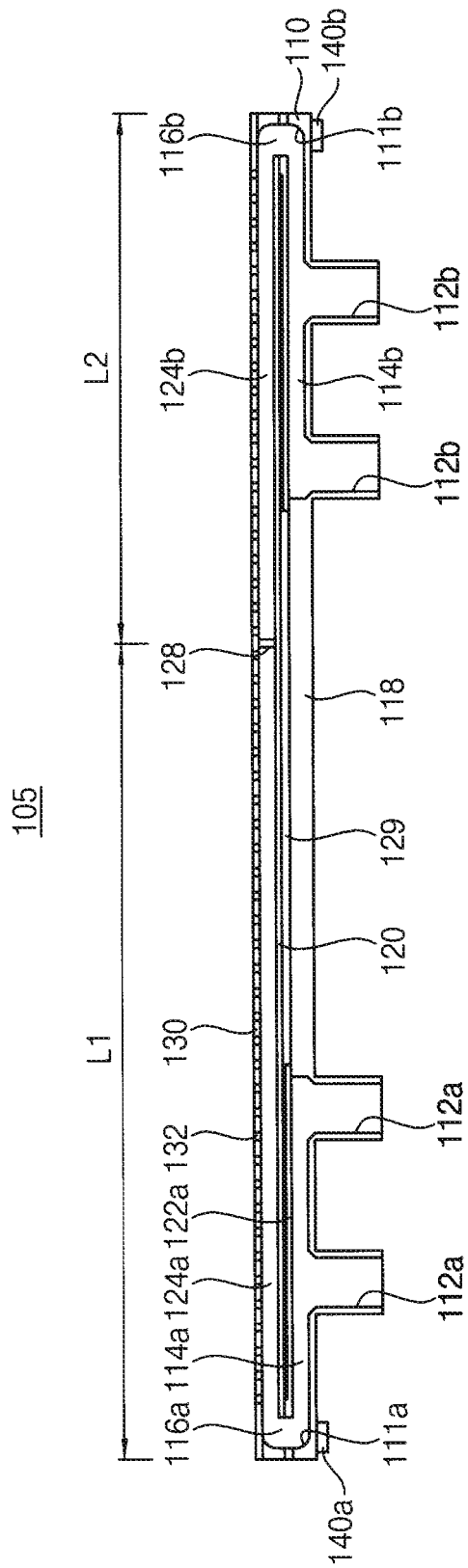

FIG. 24 is a cross-sectional view illustrating a gas injector in accordance with some example embodiments. The gas injector may be substantially the same as (e.g., the same within manufacturing tolerances and/or material tolerances) or similar to the gas injector described with reference to FIG. 23, except for lengths of first and second distribution passages. Thus, same reference numerals will be used to refer to the same or like elements as those described in the gas injector described with reference to FIG. 23, and any further repetitive explanation concerning the above elements will be omitted.

Referring to FIG. 24, a gas injector 105 may include first and second distribution passages 124a, 124b separated by a blocking plate 128.

For example, a length L1 of the first distribution passage 124a may be greater than a length L2 of the second distribution passage 124b.

In this case, the first exciting portion 44a of the microwave exciting unit 44 in FIGS. 1 and 4 may apply a microwave of a first power to an introduced ammonia gas, and the second exciting portion 44b may apply a microwave of a second power different from the first power to the introduced ammonia gas. Accordingly, a concentration of the hydrogen radical (H*) sprayed out through each of the first and second distribution passages 124a, 124b may be controlled.

Figure 25:
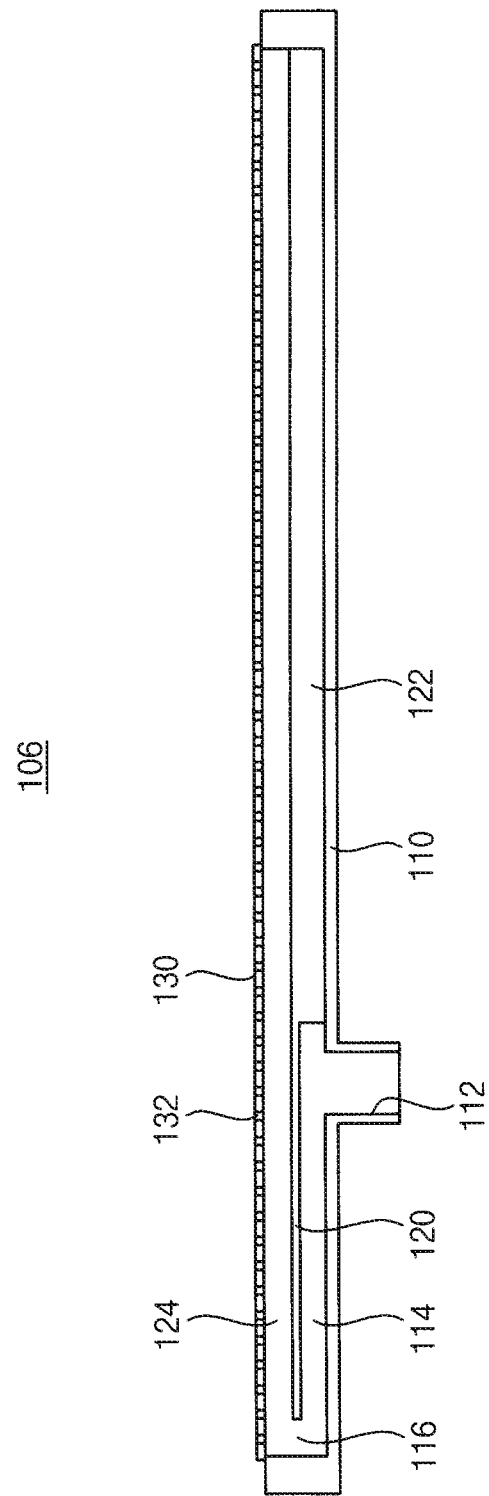

FIG. 25 is a cross-sectional view illustrating a gas injector in accordance with some example embodiments. The gas injector may be substantially the same as (e.g., the same within manufacturing tolerances and/or material tolerances) or similar to the gas injector described with reference to FIG. 5, except for the number of a gas introduction passage and a bypass passage. Thus, same reference numerals will be used to refer to the same or like elements as those described in the gas injector described with reference to FIG. 5, and any further repetitive explanation concerning the above elements will be omitted.

Referring to FIG. 25, a gas injector 106 may include a base plate 110, a compensation plate 120 and a distribution plate 130.

The base plate 110 may have a shape extending in a second direction along a sidewall of a process chamber 20, that is, a manifold 24. One gas introduction passage 112a, 112 may be formed in an outer wall of the base plate 110 facing the sidewall of the manifold 24. The gas introduction passage 112 may extend in a first direction perpendicular to the second direction.

A recess for forming a bypass passage 114 and a distribution passage 124 may be formed in an inner wall of the base plate 110. The recess may extend in the second direction. The gas introduction passage 112 may be connected to a bottom surface of the recess.

The compensation plate 120 may be installed fixedly within the recess. The compensation plate 120 may extend in the second direction. The compensation plate 120 may be spaced apart from the inner wall of the base plate 110 to define one bypass passage 114. The gas introduction passage 112 may be connected to the bypass passage 114. The bypass passage 114 may extend in the second direction.

The distribution plate 130 may be fixed on the base plate 110 to cover the recess. The distribution plate 130 may be spaced apart from the compensation plate 120 to form the distribution passage 124. The distribution passage 124 may extend from the outlet 116 of the bypass passage 114 in the reverse direction to the second direction.

A plurality of the spray holes 132 may be formed in the distribution passage 124 to be spaced apart from each other along the second direction (e.g., an extending direction of the distribution passage 124). As shown in at least FIG. 25, a length of the distribution passage 124 may be greater than a length of the bypass passage 114.

Hereinafter, a method of processing a plurality of wafers using the wafer processing apparatus in FIG. 1, and a method of manufacturing a semiconductor device using the same will be explained.

Figure 26:
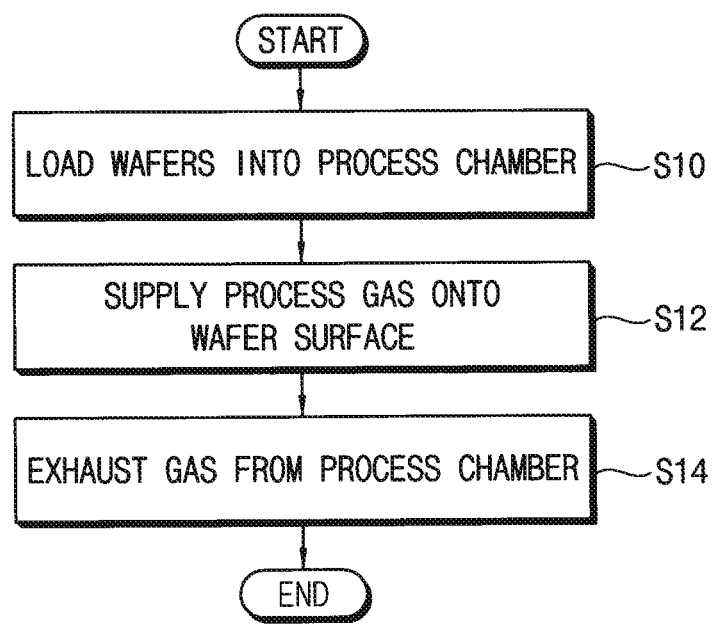

FIG. 26 is a flow chart illustrating a method of processing a wafer in accordance with some example embodiments. The method may be used to remove a native oxide layer on a wafer surface in a cleaning process. However, some example embodiments should not be construed as limited thereto.

Referring to FIGS. 1 to 4 and 26, first, a plurality of wafers W may be loaded into a process chamber 20 of a wafer processing apparatus 10 (S10).

In some example embodiments, the process chamber 20 may be a vertical batch reactor. The substrate W may be, for example, a semiconductor wafer such as a silicon wafer or a germanium wafer. Various structures (not illustrated) may be further formed on the substrate W.

For example, a conductive layer including a metal, a metal nitride, a metal silicide, a metal oxide or the like, an electrode, or an insulation layer including silicon oxide or silicon nitride may be further formed on the substrate W. In some embodiments, an insulation layer including a hole or an opening therein may be formed on the substrate W.

Then, a first process gas may be supplied toward the wafers W through spray holes 132 of a gas injector 200 installed within the process chamber 20 (S12). Additionally, a second process gas may be supplied toward the wafers W through spray holes 62 of a spray nozzle 60 installed within the process chamber 20.

The first process gas may include hydrogen radical (H*), and the second process gas may include a nitrogen fluoride (NF$_3$) gas. The nitrogen fluoride gas and the hydrogen radical may be mixed and reacted with each other to generate an ammonium fluoride (NH$_X$F$_Y$) gas. The ammonium fluoride may react with the native oxide layer on the surface of the substrate W, and thus, may be converted into volatile ammonium fluorosilicate and may be removed.

Then, a gas may be exhausted from the process chamber 20 (S14).

The gas in the process chamber 20 may be exhausted from the process chamber 20 through an exhaust port 26.

After removing the native oxide layer on the wafers W, the wafers W may be unloaded from the process chamber 20.

Hereinafter, a method of manufacturing a semiconductor device using the wafer processing method in FIG. 26 will be explained.

FIGS. 27, 28, 29, and 30 are vertical cross-sectional views illustrating a method of manufacturing a vertical memory device in accordance with some example embodiments. In all figures in this specification, a direction substantially perpendicular (e.g., perpendicular within manufacturing tolerances and/or material tolerances) to a top surface of a substrate is referred to as a first direction, and two directions substantially parallel (e.g., parallel within manufacturing tolerances and/or material tolerances) to the top surface of the substrate and substantially perpendicular (e.g., perpendicular within manufacturing tolerances and/or material tolerances) to each other are referred to as a second direction and a third direction. Additionally, a direction indicated by an arrow in the figures and a reverse direction thereto are considered as the same direction. The definition of the direction mentioned above is identical in all figures.

Figure 27:
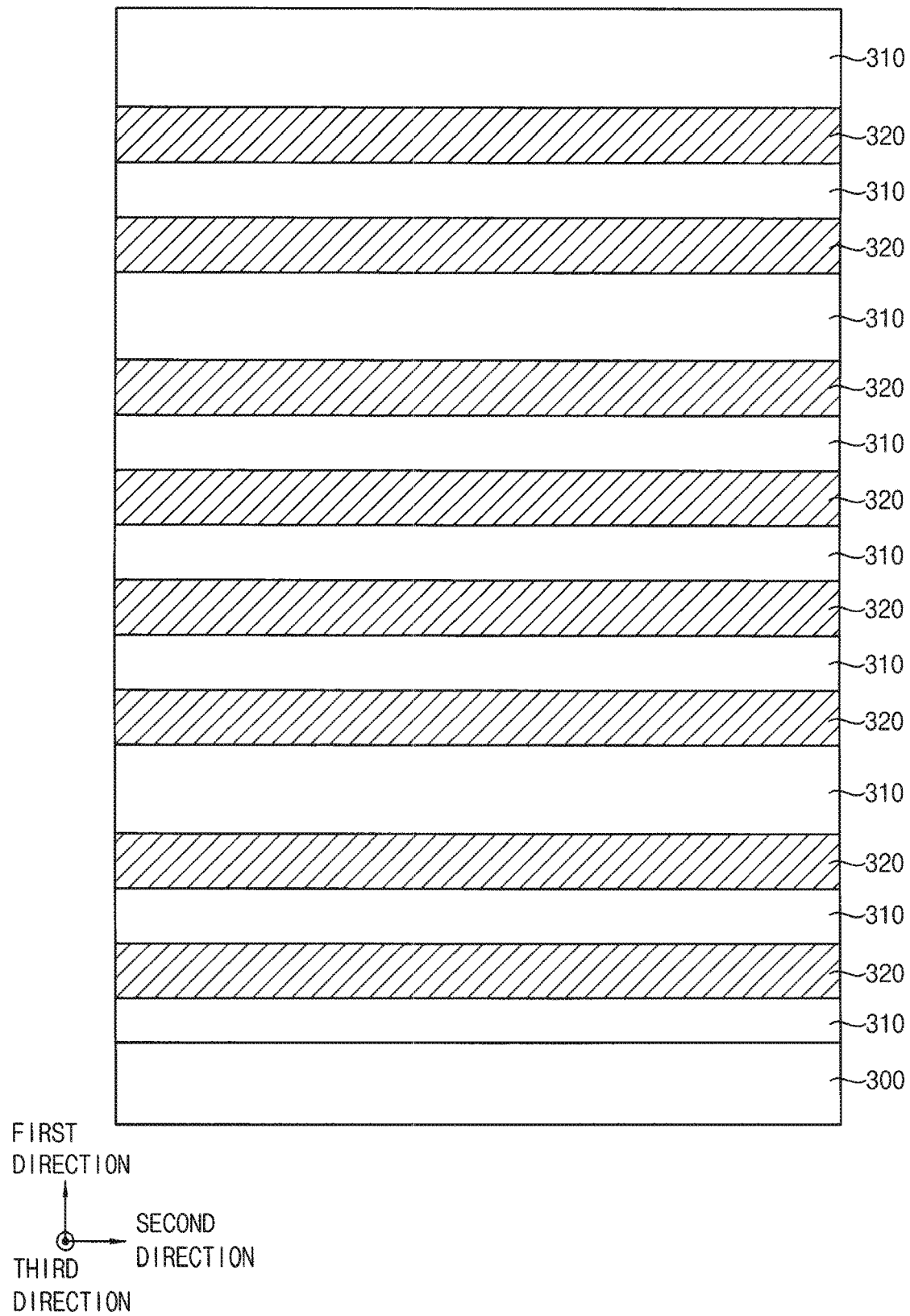

Referring to FIG. 27, a first insulation layer 310 and a sacrificial layer 320 may be alternately and repeatedly formed on a wafer substrate 300 and, thus, a plurality of first insulation layers 310 and a plurality of sacrificial layers 320 may be alternately formed on each other at a plurality of levels in the first direction, respectively. The wafer substrate 300 may include a semiconductor material, for example, silicon and/or germanium.

In some example embodiments, the first insulation layers 310 and the sacrificial layers 320 may be formed by, for example, a chemical vapor deposition (CVD) process, a plasma enhanced chemical vapor deposition (PECVD) process, an atomic layer deposition process (ALD) process, etc.

The first insulation layer 310 may be formed to include a silicon oxide, and the first sacrificial layer 320 may be formed to include, for example, a material with an etch selectivity to the first insulation layer 310, e.g., silicon nitride.

Figure 28:
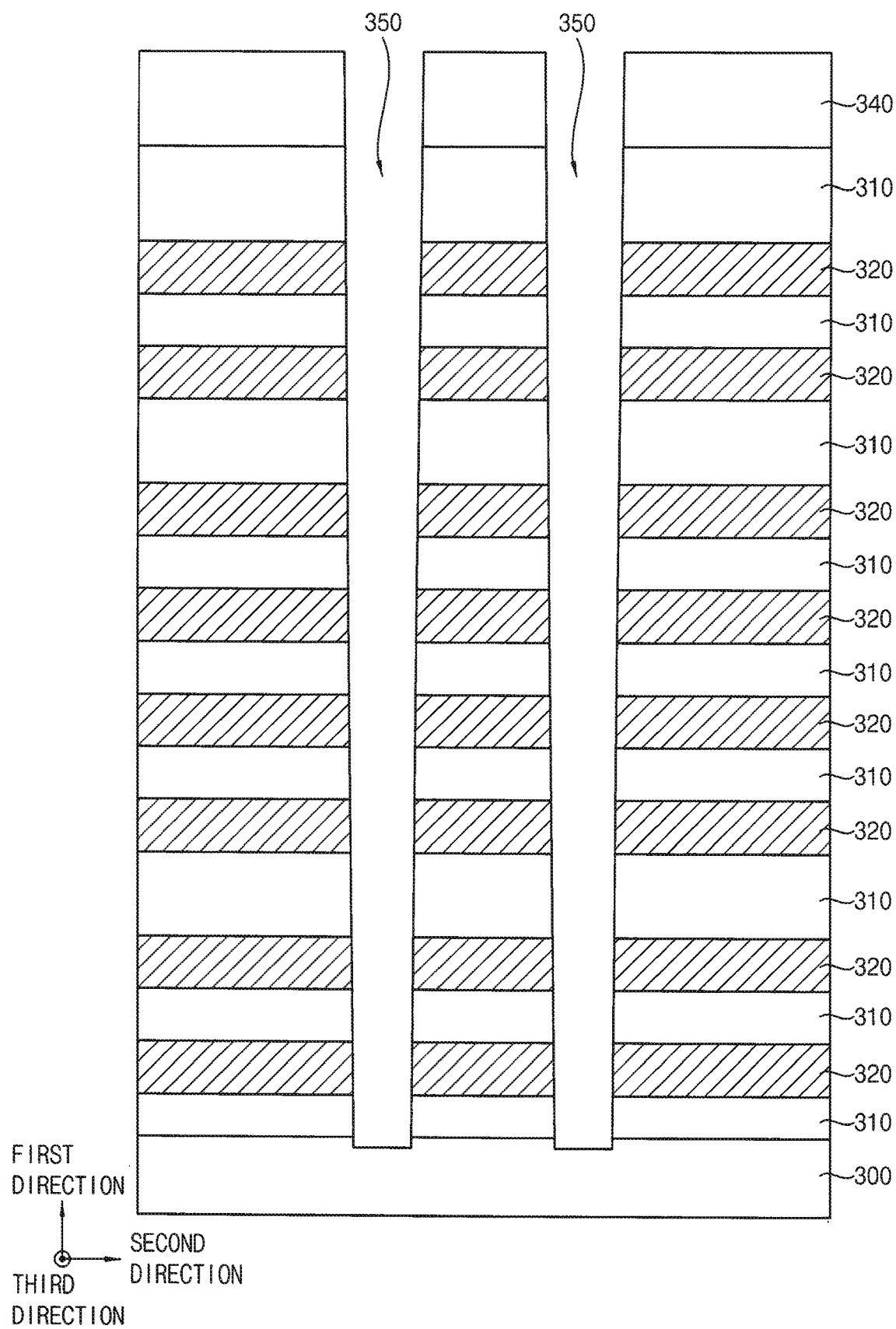

Referring to FIG. 28, a plurality of holes 350 may be formed through the first insulation layers 310 and the sacrificial layers 320 to expose a top surface of the wafer substrate 300.

In some example embodiments, after forming a hard mask 340 on the uppermost first insulation layer 310, the first insulation layers 310 and the sacrificial layers 320 may be dry etched using the hard mask 340 as an etch mask to form the holes 350. Thus, the holes 350 may be formed to extend in the first direction. Due to the characteristics of a dry etch process, the holes 350 may be of a width that becomes gradually smaller from a top portion to a bottom portion thereof.

Then, a cleaning process may be performed to remove a native oxide layer on the top surface of the wafer substrate 300 exposed by the holes 350 using the wafer processing method described with reference to FIGS. 1 to 4 and 26.

Figure 29:
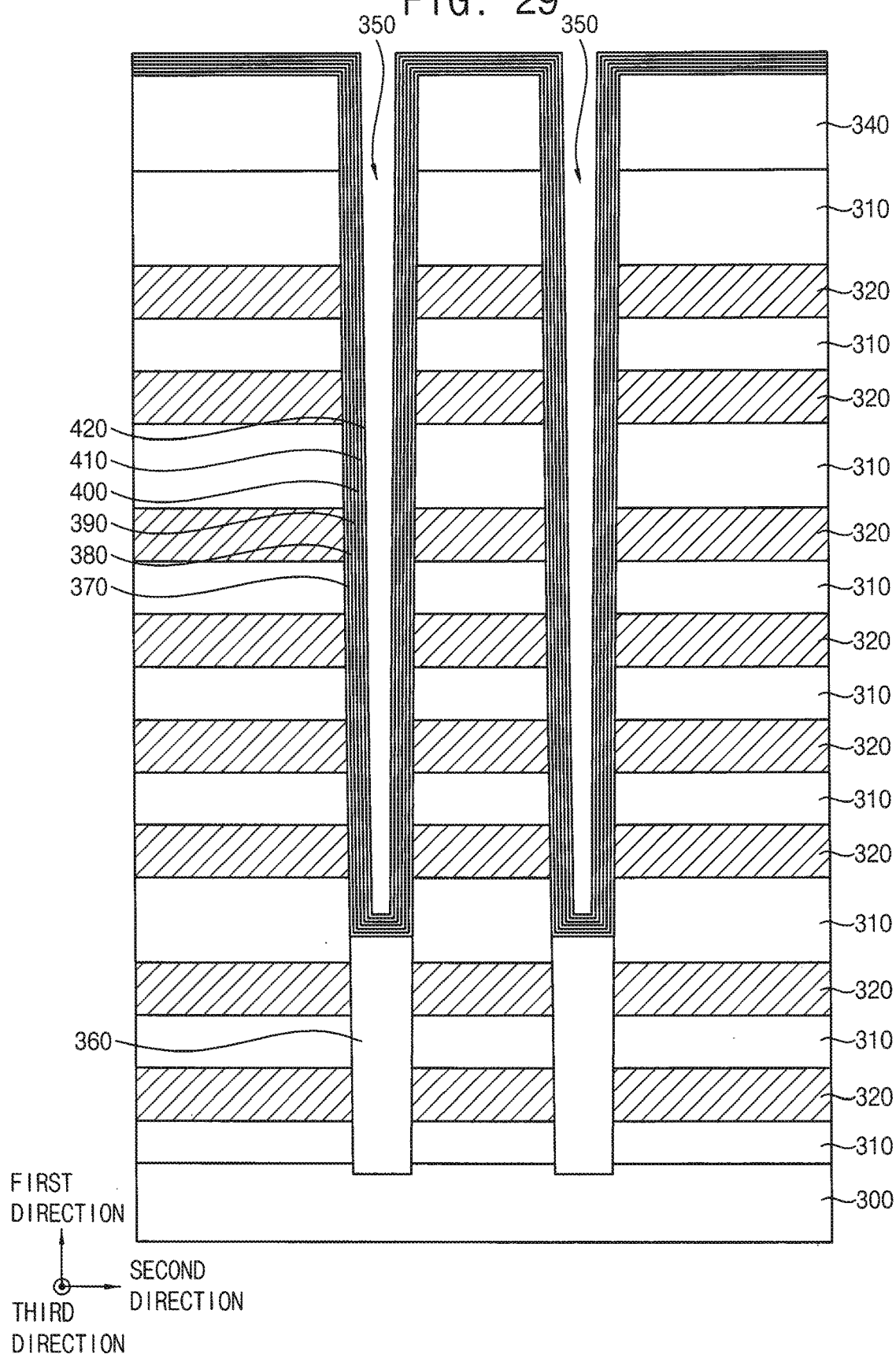

Referring to FIG. 29, a semiconductor pattern 360 may be formed to partially fill each of the holes 350 (also referred to herein as "openings"), and then, a first blocking layer 370, a charge storage layer 380, a tunnel insulation layer 390, a first channel layer 400, an etch stop layer 410, and a spacer layer 420 may be sequentially formed on sidewalls of the holes 350, a top surface of the semiconductor pattern 360, and a top surface of the hard mask 340.

The semiconductor pattern 360 may be formed by a selective epitaxial growth process using the top surface of the wafer substrate 300 exposed by the high aspect ratio openings 350 as a seed to partially fill each of the high aspect ratio holes 350.

The first blocking layer 370, the charge storage layer 380 and the tunnel insulating layer 390 may be sequentially formed on the wafer substrate 300 with a uniform thickness by, e.g., an ALD process.

Figure 30:
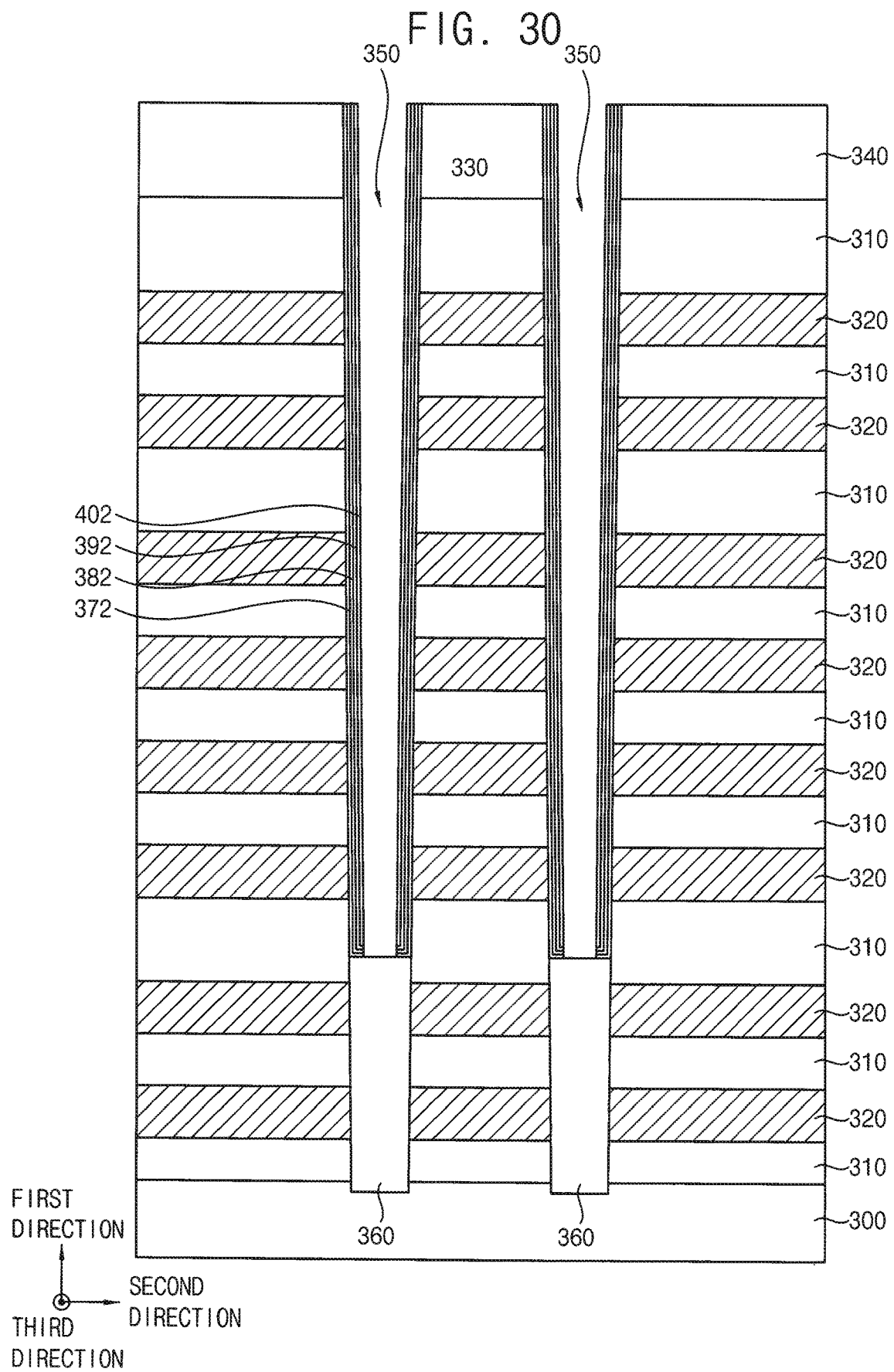

Referring to FIG. 30, a portion of the spacer layer 420 on the top surface of the semiconductor pattern 360 may be removed by etching the spacer layer 420 anisotropically to form a spacer on the sidewall of each of the holes 350, and the etch stop layer 410 and the first channel layer 400 may be etched using the spacer as an etch mask to form an etch stop layer pattern and a first channel 402, respectively, exposing a portion of the tunnel insulation layer 390. In other words, portions of the etch stop layer 410 and the first channel layer 400 formed on the central top surface of the semiconductor pattern 360 and the top surface of the hard mask 340 may be removed.

Then, an exposed portion of the tunnel insulation layer 390, the charge storage layer 380 an the first blocking layer 370 therebeneath may be removed to form a tunnel insulation layer pattern 392 and a charge storage layer pattern 382 and a first blocking layer pattern 372. Thus, the central top surface of the semiconductor pattern 360 and the top surface of the hard mask 340 may be exposed.

Then, a cleaning process may be performed to remove a native oxide layer on the exposed surface of the semiconductor pattern 360 using the wafer processing method described with reference to FIGS. 1 to 4 and 26.

Then, although it is not illustrated in the figures, the sacrificial layers 320 may be removed, and then gate electrodes (e.g., a ground selection line, word lines and a string selection line) that are sequentially formed in the first direction from the top surface of the wafer substrate 300 may be formed. Bit lines may be formed on a resultant structure having the gate electrodes. Thus, the vertical type memory device may be fabricated by the aforementioned processes.

The semiconductor device such as the DRAM or the vertical-type NAND memory device formed using the wafer processing method and wafer processing apparatus according to the some example embodiments may be applied to a system such as a computing system. The system may include a computer, a mobile computer, a laptop computer, a personal computer, a tablet, a mobile phone, or a digital music player.

The foregoing is illustrative of some example embodiments and is not to be construed as limiting thereof. Although a few some example embodiments have been described, those skilled in the art will readily appreciate that many modifications are possible in some example embodiments without materially departing from the novel teachings and advantages of the inventive concepts. Accordingly, all such modifications are intended to be included within the scope of some example embodiments as defined in the claims.

What is claimed is:

1. A gas injector, comprising:
a first gas introduction passage and a second gas introduction passage, each gas introduction passage of the first gas introduction passage and the second gas introduction passage extending in a first direction toward a central axis of a process chamber, each gas introduction passage of the first gas introduction passage and the second gas introduction passage configured to direct a process gas from a gas supply source into the process chamber and toward the central axis of the process chamber;
a first bypass passage extending from the first gas introduction passage in a second direction, the second direction substantially perpendicular to the first direction;
a second bypass passage extending from the second gas introduction passage in a reverse direction to the second direction;
a first distribution passage isolated from the first bypass passage in the first direction, connected with an outlet of the first bypass passage at one end of the first distribution passage, and extending from the outlet of the first bypass passage in the reverse direction to the second direction;
a second distribution passage isolated from the second bypass passage in the first direction, connected with an outlet of the second bypass passage at one end of the second distribution passage, and extending from the outlet of the second bypass passage in the second direction;
a plurality of spray holes in a distribution plate that at least partially defines an outer surface of both of the first and second distribution passages and further defines an outer surface of the gas injector, the plurality of spray holes configured to spray the process gas from the first and second distribution passages to an exterior of the gas injector and toward the central axis of the process chamber; and
a compensation plate extending in the second direction, such that the compensation plate is between the first bypass passage and the first distribution passage in the first direction and is further between the second bypass passage and the second distribution passage in the first direction, such that the first distribution passage and the first bypass passage extend in parallel to each other on opposite sides of the compensation plate and the second distribution passage and the second bypass passage extend in parallel to each other on opposite sides of the compensation plate,
wherein the first distribution passage and the second distribution passage are each defined in the first direction between the compensation plate and the distribution plate,
wherein the compensation plate is further between the outlet of the first bypass passage and the outlet of the second bypass passage in the second direction, such that the outlet of the first bypass passage and the outlet of the second bypass passage are aligned in the second direction, and the outlet of the first bypass passage and the outlet of the second bypass passage are each configured to direct the process gas out of the first and second bypass passages, respectively, and into the first and second distribution passages, respectively, in the first direction,
wherein the first gas introduction passage and the second gas introduction passage are not coaxial.

2. The gas injector of claim 1, wherein
a length of the first distribution passage is greater than a length of the first bypass passage, and
a length of the second distribution passage is greater than a length of the second bypass passage.

3. The gas injector of claim 1, wherein a length of the first distribution passage is substantially the same as a length of the second distribution passage.

4. The gas injector of claim 1, wherein a length of the first distribution passage is different from a length of the second distribution passage.

5. The gas injector of claim 1, wherein the first distribution passage is connected to the second distribution passage.

6. The gas injector of claim 1, wherein the first distribution passage and the second distribution passage are separated by a blocking plate.

7. The gas injector of claim 1, wherein
a sectional area of the first distribution passage is proportional to a distance along the first distribution passage from the outlet of the first bypass passage, and
a sectional area of the second distribution passage is proportional to a distance along the second distribution passage from the outlet of the second bypass passage.

8. A gas injector, comprising:
a base plate including an inner surface at least partially defining a recess and further defining at least a first gas introduction passage in an outer wall of the base plate, such that the first gas introduction passage is connected to a bottom surface of the recess and extending in a first direction toward a central axis of a process chamber, the first gas introduction passage configured to direct a process gas from a gas supply source into the process chamber, toward the central axis of the process chamber;

a compensation plate fixed to the base plate within the recess; and a distribution plate that is fixed on the base plate to cover the recess, wherein the compensation plate is isolated in the first direction and a second direction from direct contact with the inner surface of the base plate, and the compensation plate is isolated from direct contact with the distribution plate, the second direction substantially perpendicular to the first direction such that that the base plate, compensation plate, and distribution plate collectively define, within the recess:
  a first bypass passage extending from the first gas introduction passage in the second direction,
  an outlet of the first bypass passage, and
  a first distribution passage isolated from the first bypass passage in the first direction and extending from the outlet of the first bypass passage in a reverse direction to the second direction, wherein the distribution plate and the compensation plate collectively define the first distribution passage in the first direction between the compensation plate and the distribution plate, wherein the distribution plate has opposite surfaces that at least partially define an outer surface of the first distribution passage and an outer surface of the gas injector, respectively, and the distribution plate includes a first plurality of spray holes spaced apart from each other along an extending direction of the first distribution passage and extending through the distribution plate between the first distribution passage and an exterior of the gas injector, the first plurality of spray holes configured to spray the process gas from the first distribution passage to the exterior of the gas injector and toward the central axis of the process chamber, wherein the base plate further defines, in the outer wall of the base plate, a second gas introduction passage spaced apart from the first gas introduction passage in the reverse direction to the second direction, wherein the base plate, compensation plate, and distribution plate further collectively define, within the recess,
  a second bypass passage extending from the second gas introduction passage in the reverse direction to the second direction,
  an outlet of the second bypass passage, and
  a second distribution passage isolated from the second bypass passage in the first direction and extending from the outlet of the second bypass passage in the second direction, wherein the distribution plate and the compensation plate further collectively define the second distribution passage in the first direction between the compensation plate and the distribution plate, wherein the distribution plate further includes a second plurality of spray holes spaced apart from each other along an extending direction of the second distribution passage and extending through the distribution plate between the second distribution passage and the exterior of the gas injector, the second plurality of spray holes configured to spray the process gas from the first distribution passage to the exterior of the gas injector and toward the central axis of the process chamber, wherein the first gas introduction passage and the second gas introduction passage are not coaxial.

9. The gas injector of claim 8, wherein
  a length of the first distribution passage is greater than a length of the first bypass passage, and
  a length of the second distribution passage is greater than a length of the second bypass passage.

10. The gas injector of claim 8, wherein
  a sectional area of the first distribution passage is proportional to a distance along the first distribution passage from the outlet of the first bypass passage, and
  a sectional area of the second distribution passage is proportional to a distance along the second distribution passage from the outlet of the second bypass passage.

11. The gas injector of claim 8, wherein the compensation plate includes an internal gap.

12. The gas injector of claim 8, wherein the compensation plate includes quartz or metal.

13. The gas injector of claim 8, wherein a length of the first distribution passage is different from a length of the second distribution passage.

14. A wafer processing apparatus, comprising:
  a process chamber extending in a vertical direction and having a central axis extending in the vertical direction;
  a boat configured to be loaded into the process chamber, the boat configured to hold a plurality of wafers; and
  a gas injector configured to supply a process gas into the process chamber and toward the central axis of the process chamber, the gas injector including:
    a base plate including an inner surface at least partially defining a recess and further defining at least a gas introduction passage in an outer wall of the base plate, such that the gas introduction passage is connected to a bottom surface of the recess and extending in a first horizontal direction toward the central axis of the process chamber,
    a compensation plate fixed to the base plate within the recess; and
    a distribution plate that is fixed on the base plate to cover the recess,
    wherein the compensation plate is isolated in the first horizontal direction and a second direction from direct contact with the inner surface of the base plate, and the compensation plate is isolated from direct contact with the distribution plate, wherein the second direction is substantially parallel to the vertical direction and is substantially perpendicular to the first horizontal direction such that the base plate, compensation plate, and distribution plate collectively define, within the recess,
      a bypass passage extending from the gas introduction passage in the second direction,
      an outlet of the bypass passage, and
      a distribution passage isolated from the bypass passage in the first horizontal direction and extending from the outlet of the bypass passage in a reverse direction to the second direction,
    wherein the distribution plate and the compensation plate collectively define the distribution passage in the first horizontal direction between the compensation plate and the distribution plate,
    wherein the distribution plate has opposite surfaces that at least partially define an outer surface of the distribution passage and an outer surface of the gas injector, respectively, and the distribution plate includes a plurality of spray holes spaced apart from each other along an extending direction of the distribution passage and extending through the distribution plate between the distribution passage and an exterior of the gas injector, the plurality of spray holes configured to spray the process gas from the distribution passage to the exterior of the gas injector and toward the central axis of the process chamber.

15. The wafer processing apparatus of claim 14, further comprising:
   a gas supply configured to supply the process gas to the gas introduction passage.

16. The wafer processing apparatus of claim 15, wherein the gas supply is configured to supply a hydrogen radical to the gas introduction passage to remove a native oxide layer on a surface of a wafer of the plurality of wafers.

17. The wafer processing apparatus of claim 14, further comprising:
   an exhaust portion configured to exhaust a gas from the process chamber.

18. The wafer processing apparatus of claim 14, further comprising:
   a spray nozzle adjacent to the gas injector, the spray nozzle extending in the vertical direction and configured to supply a second process gas toward the central axis of the process chamber.

* * * * *